United States Patent [19]

Miyabe

[11] Patent Number: 5,614,871

[45] Date of Patent: Mar. 25, 1997

[54] VOLTAGE-CONTROLLED OSCILLATOR CIRCUIT

[75] Inventor: Satoru Miyabe, Tokyo, Japan

[73] Assignee: Nippon Precision Circuits Inc., Tokyo, Japan

[21] Appl. No.: 589,686

[22] Filed: Jan. 22, 1996

[30] Foreign Application Priority Data

Jan. 25, 1995 [JP] Japan .................................. 7-009972
Jan. 9, 1996 [JP] Japan .................................. 8-001562

[51] Int. Cl.$^6$ ........................................... H03B 5/24
[52] U.S. Cl. ...................... 331/111; 331/143; 331/177 R
[58] Field of Search ............................ 331/34, 111, 143, 331/177 R

[56] References Cited

U.S. PATENT DOCUMENTS 5,194,831  3/1993  Jackson .................................. 331/111

*Primary Examiner*—David Mis
*Attorney, Agent, or Firm*—Jordan and Hamburg

[57] ABSTRACT

There is disclosed a voltage-controlled oscillator circuit capable of being operated at low power supply voltages and accomplishing low electric power consumption. The circuit permits the duty cycle to be controlled well. The circuit is capable of operating at high speeds. The circuit comprises a first and a second dynamic latch circuits producing oscillation output. Each dynamic latch circuit consists of a series combination of a P-channel MOS transistor and an N-channel MOS transistor. An output terminal is connected to the junction of these two transistors. The output from each latch circuit is inverted according to the voltage at the gate of each MOS transistor and dynamically latches the state of the output. This inversion is performed by turning on the MOS transistors by first and second capacitive elements and by first and second comparator circuits. The capacitive elements are charged and discharged by the outputs from the dynamic latch circuits. Voltages for charging the capacitive elements are applied to the comparator circuits. The switching operation is performed at a higher speed than where a flop-flop is used. Consequently, the oscillation frequency is improved. These MOS transistors do not simultaneously conduct and so electric currents passing through the transistors can be suppressed. Since the timing at which the inversion is made is determined by the charging rates of the capacitive elements, the duty cycle can be controlled well.

14 Claims, 26 Drawing Sheets

VOLTAGE-CONTROLLED OSCILLATOR CIRCUIT

BACKGROUND OF THE INVENTION

1. Field of the Invention

The present invention relates to a voltage-controlled oscillator circuit.

2. Description of the Related Art

Generally, a quartz oscillator circuit is used as a clock pulse source. A quartz oscillator circuit is fundamentally of the resonant oscillation type and so it is difficult to obtain any desired frequency other than the resonant frequency. On the other hand, with a voltage-controlled oscillator circuit, a desired frequency can be easily obtained by adjusting the charging and discharging times of capacitors or capacitive elements. For this reason, a voltage-controlled oscillator circuit is normally used in an apparatus which needs different clock frequencies.

Today, CMOS integrated circuits of low power consumption have become widespread. With this trend, various voltage-controlled oscillator circuits of the CMOS configuration are being developed. Voltage-controlled oscillator circuits of the CMOS configuration are classified into two major categories: single-capacitor type and double-capacitor type.

A typical voltage-controlled oscillator circuit of the single-capacitor type is a ring oscillator type as shown in 17(a). In this configuration, the source and drain currents of a CMOS inverter 151 are controlled, using voltage-controlled current sources 152 and 153, respectively. The charging and discharging times of a capacitive element 154 disposed on the output side of the CMOS inverter 151 are controlled, thus controlling the oscillation frequency variations in the voltage at a terminal 15A of this voltage-controlled oscillator circuit are shown in the waveform diagram of FIG. 17(b). As can be seen from this diagram, when the N-channel MOS transistor of the CMOS inverter 151 turns off and the P-channel MOS transistor turns on, an electric current from the voltage-controlled current source 152 on the side of the source electrically charges the capacitive element 154, thus increasing the voltage at the terminal 15A. This charging time TC is determined by the value of the current from the voltage-controlled current source 152. The voltage at the terminal 15A is reduced when the P-channel MOS transistor of the CMOS inverter 151 turns off and the N-channel MOS transistor turns on, thus discharging the capacitive element 154 via its source and via the voltage-controlled current source 153 on the side of the source. This discharging time TD is determined by the voltage-controlled current source 153 on the side of the source electrode. The period Tc, i.e., the oscillation frequency, is controlled by controlling these charging and discharging times by the voltage-controlled current sources. In FIG. 17(b), Td indicates the delay time introduced by the CMOS inverters 155 and 156. The voltage developed between power supply terminals VDD and VSS is set to 5 V. The threshold voltage of the CMOS inverter 151 is 2.5 V.

A voltage control circuit disclosed in Japanese Patent Laid-Open No. 62215/1984 is one example of the double-capacitor type voltage-controlled oscillator circuit. As shown in FIG. 18(a), this circuit comprises two CMOS inverters 162 and 163 having P-channel MOS transistors whose source electrodes are both connected to a voltage-controlled current source 161. One capacitive element 164 is connected with the output terminal of one CMOS inverter 162. One comparator circuit 165 compares the charging voltage for the capacitive element 164 with a given threshold voltage $V_{REF}$. Another capacitive element 166 is connected with the output terminal of the other CMOS inverter 163. Another comparator circuit 167 compares the charging voltage for the capacitive element 166 with the given threshold voltage. The voltage control circuit further includes a flip-flop 168 having a set terminal S connected with the output of one comparator circuit and a reset terminal R connected with the output terminal of the other comparator circuit. The flip-flop 168 further has output terminals Q and $\overline{Q}$ for producing an output and an inverted output. The output terminal Q is connected with the input terminal of one CMOS inverter 162. The output terminal $\overline{Q}$ is connected with the input terminal of the other CMOS inverter 163. In this voltage-controlled oscillator circuit, when the output from the flip-flop 168 goes low (L) and the inverted output goes high (H), the N-channel MOS transistor of one CMOS inverter turns off, while the P-channel MOS transistor turns on. As a result, one capacitive element is charged. At the same time, the P-channel MOS transistor of the other CMOS inverter turns off and the N-channel MOS transistor turns on. Hence, the other capacitive element is discharged. The voltages at the various terminals are shown in the waveform diagram of FIG. 18(b). As one capacitive element is charged, the voltage at a terminal 16A increases. When the given threshold voltage $V_{REF}$ is exceeded, the output from one comparator circuit goes high (H). The flip-flop 168 is set. The output from the flip-flop 168 goes high (H). The inverted output goes low (L). In response to this, one capacitive element 164 starts to be discharged. At the same time, the other capacitive element 166 starts to be charged. As the voltage at a terminal 16B increases and goes beyond the given threshold voltage $V_{REF}$, the output from the other comparator circuit 167 goes high (H), thus resetting the flip-flop 168. The inverted output changes from a high (H) state to a low (L) state. As described thus far, in this voltage-controlled oscillator circuit, the two capacitive elements are alternately charged and discharged to produce an oscillation output across the output terminals Q and $\overline{Q}$. The oscillation frequency can be controlled by controlling the charging times of the two capacitive elements by means of the voltage-controlled current sources. In FIG. 18(b), TC indicates the charging time. Td indicates the delay time. Tc indicates the period.

The above-described single-capacitor type voltage-controlled oscillator circuit is essentially composed of a ring oscillator consisting of CMOS inverters and hence relatively simple in structure. Although this circuit is capable of operating at low voltages, the charging and discharging times are not uniform because of the difference in performance between the P-channel and N-channel MOS transistors forming the CMOS inverter 151. As a consequence, the duty cycle cannot be well controlled.

In the above-described double-capacitor type voltage-controlled oscillator circuit, the timing at which the flip-flop is set and reset (i.e., the periods for which the flip-flop is at high and low levels, respectively) is determined by the time in which the capacitive elements are charged by the MOS transistors of the same type (in the example shown in FIG. 18(a), the P-channel MOS transistors). Therefore, the duty cycle can be controlled well. However, the logic gate such as a NOR gate forming the flop-flop introduces a large delay. That is, as is well known in the art, the simplest R-S flip-flop comprises a pair of NOR gates No0 and No1, as shown in FIG. 19(a). These NOR gates No0 and No1 have input terminals b0 and b1, respectively, which are connected with output terminals Q and $\overline{Q}$ of mutually opposite gates. The NOR gates No0 and No1 further have input terminals S and R, respectively, which are a set terminal and a reset terminal, respectively. An equivalent circuit of this circuitry is shown in FIG. 19(b). As can be seen from this figure, a high (H) signal is first applied to the input terminal S. The following sequence of operations is carried out until the output terminal Q goes high (H). The N-channel MOS transistor connected with the input terminal S turns on, thus lowering the voltage at the input terminal b1. In response to this, the NOR gate no1 is inverted. This increases the voltage at the input terminal b0. In response to this, the NOR gate no0 is inverted. This further lowers the voltage at the input terminal b1. Because the plurality of MOS transistors are connected in series between the power supply and the output terminals, the delay introduced by this series of operations is made larger by the capacitive and resistive components associated with the MOS transistors than the delay of the CMOS inverters that are delay elements in the ring oscillator. For this reason, the double-capacitor type voltage-controlled oscillator circuit has the disadvantage that its operation speed is low. Hence, high frequencies cannot be obtained. As can be seen from FIG. 19(b), in the double-capacitor type voltage-controlled oscillator circuit, a large amount of electric current passes through the flip-flop. This makes it difficult to suppress the electric power consumption. In addition, the flip-flop is unsuited for lower power voltage operation, because a plurality of MOS transistors are connected in series between the power supply and the output terminals.

SUMMARY OF THE INVENTION

It is an object of the present invention to provide a voltage-controlled oscillator circuit which can operate at a low power voltage, accomplishes low electric power consumption, permits the duty factor to be controlled well, and enables high-speed operation.

The novel voltage-controlled oscillator circuit uses first and second dynamic latch circuits for maintaining the oscillation output at a high (H) level and at a low (L) level, respectively. Each output terminal of these dynamic latch circuits is connected to the junction of an N-channel and a P-channel MOS transistors which are connected in series. The state of the output terminal is maintained by the parasitic capacitance at this junction. The state of the output terminal is inverted by turning on any one of the N- and P-channel MOS transistors. This permits high-speed operation. Since no CMOS circuit is used in the latch circuits, the electric current passing through these portions is suppressed. As a consequence, the electric power consumption can be curtailed.

Other objects and features of the invention will appear in the course of the description thereof, which follows.

DETAILED DESCRIPTION OF THE INVENTION

The present invention provides a double-capacitor type voltage-controlled oscillator circuit. As described above, in the prior art double-capacitor type voltage-controlled oscillator circuit, a flip-flop consisting of CMOS logic gates is used to latch the logic level produced at the oscillation output terminal at a high (H) or a low (L) level. This flip-flop is one of causes of operation speed decrease and electric power consumption increase. Accordingly, in the present invention, instead of the flip-flop, dynamic latch circuits (described later) are provided to enhance the operation speed of the double-capacitor type voltage-controlled oscillator circuit. Also, lower electric power consumption is accomplished. Furthermore, lower power voltage operation is attained.

Figure 1:
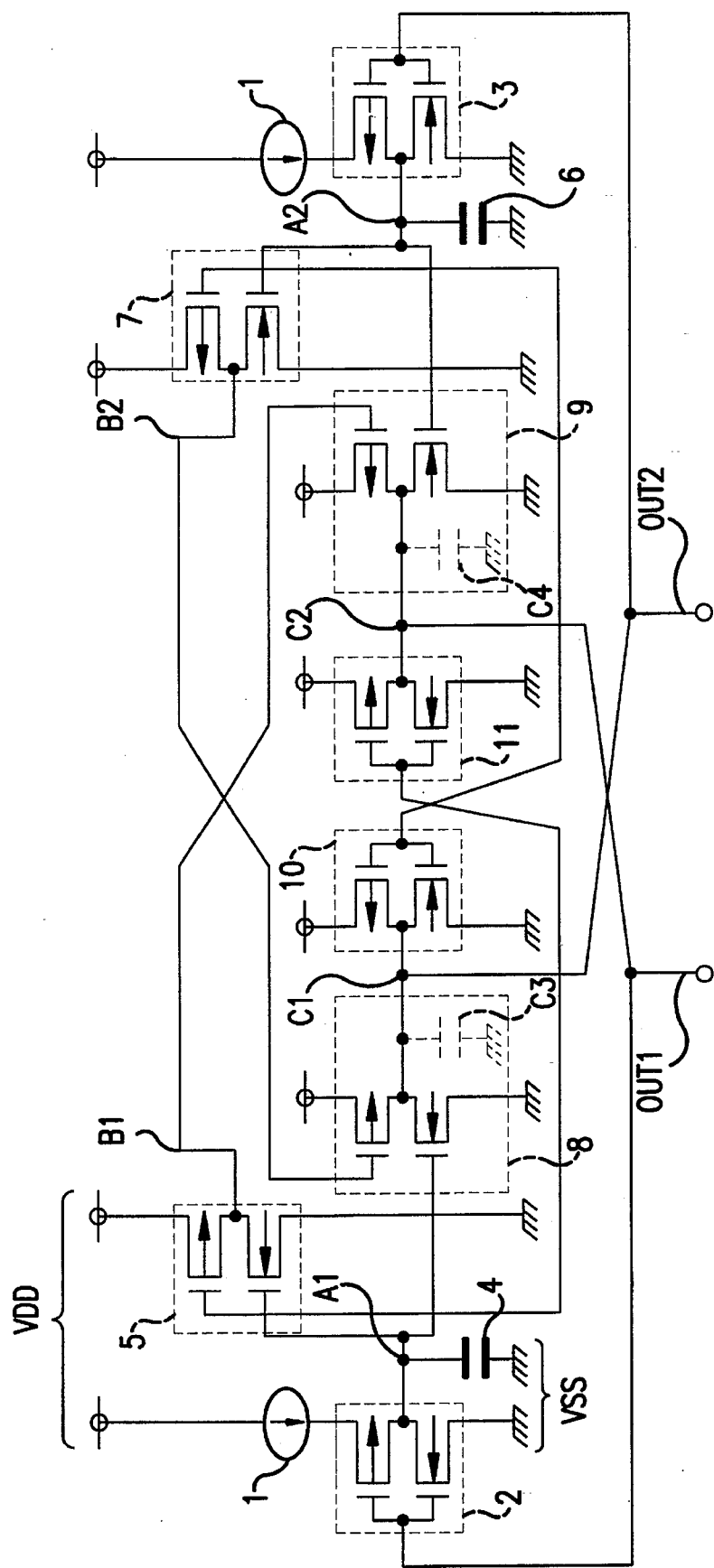
FIG. 1 is an electric circuit diagram of a voltage-controlled oscillator circuit according to the invention.

One example of the novel voltage-controlled oscillator circuit is first described. FIG. 1 is an electric circuit diagram showing the configuration of this example. This voltage-controlled oscillator circuit has well-known voltage-controlled current sources 1 acting as current sources. These current sources produce electric currents according to control voltages applied to control terminals (not shown).

The voltage-controlled oscillator circuit further includes a first CMOS inverter 2 and a second CMOS inverter 3 each of which has a P-channel MOS transistor. The source electrodes of the P-channel MOS transistors of these inverters are connected to the voltage-controlled current sources 1, respectively. The source electrodes of the N-channel MOS transistors are connected to a power supply terminal VSS (0 V).

A first capacitive element 4 has one terminal connected with the output terminal of the first CMOS inverter 2. The other terminal is connected with the power supply terminal VSS. The first capacitive element 4 is electrically charged by an electric current from the corresponding voltage-controlled current source 1 via the P-channel MOS transistor of the first CMOS inverter 2. The first capacitive element 4 is discharged via the N-channel MOS transistor. This first capacitive element 4 can be a parasitic capacitor such as the gate capacitance of a MOS transistor.

A first comparator circuit 5 produces an output whose state differs according to whether the charging voltage for the first capacitive element 4 has exceeded the reference voltage or not. The first comparator circuit 5 comprises a P-channel MOS transistor and an N-channel MOS transistor which are connected in series. An output terminal is connected to the junction of these two transistors. The charging voltage for the first capacitive element 4 is applied to the gate of the N-channel MOS transistor. The output from a first dynamic latch circuit (described later) is applied to the gate of the P-channel MOS transistor.

A second capacitive element 6 has one terminal connected with the output terminal of the second CMOS inverter 3. The other terminal is connected with the power supply terminal VSS. The second capacitive element 6 is electrically charged by an electric current from the corresponding voltage-controlled current source 1 via the P-channel MOS transistor of the second CMOS inverter 3. The second capacitive element 6 is discharged via the N-channel MOS transistor. The second capacitive element 6 can be a parasitic capacitance such as the gate capacitor of a MOS transistor.

A second comparator circuit 7 produces an output whose state differs according to whether the charging voltage for the second capacitive element 6 has exceeded the reference voltage. The second comparator circuit 7 comprises a P-channel MOS transistor and an N-channel MOS transistor which are connected in series. An output terminal is connected to the junction of these two transistors. The charging voltage for the second capacitive element 6 is applied to the gate of the N-channel MOS transistor. The output from a second dynamic latch circuit (described later) is applied to the gate of the P-channel MOS transistor.

The aforementioned first dynamic latch circuit is indicated by reference numeral 8 and consists of a series combination of a P-channel MOS transistor and an N-channel MOS transistor. An output terminal is connected to the junction of these two transistors. The charging voltage for the first capacitive element is applied to the gate of the N-channel MOS transistor. The output from the second comparator circuit 7 is applied to the gate of the P-channel MOS transistor. The output from the first dynamic latch circuit 8 is delivered to the input terminal of the second CMOS inverter 3. The output terminal has parasitic capacitance such as the gate capacitance of a MOS transistor connected to the following stage. For convenience, the parasitic capacitance is expressed as a capacitive element C3.

The aforementioned second dynamic latch circuit is indicated by reference numeral 9 and consists of a P-channel MOS transistor and an N-channel MOS transistor which are connected in series. An output terminal is connected to the junction of these two transistors. The charging voltage for the second capacitive element is applied to the gate of the N-channel MOS transistor. The output from the first comparator circuit 5 is applied to the gate of the P-channel MOS transistor. The output from the second dynamic latch circuit 9 is delivered to the input terminal of the first CMOS inverter 2. The output terminal has parasitic capacitance such as the gate capacitance of a MOS transistor connected to the following stage. For convenience, the parasitic capacitor is expressed as a capacitive element C4.

CMOS inverters 10 and 11 are connected in parallel in mutually opposite senses between the output terminal of the first dynamic latch circuit 8 and the output terminal of the second dynamic latch circuit 9.

The output terminal of the second dynamic latch circuit 9 is equipped with an output terminal OUT1. The output terminal of the first dynamic latch circuit 8 is equipped with an output terminal OUT2. Oscillation output is produced across the output terminals OUT1 and OUT2.

Figure 2:
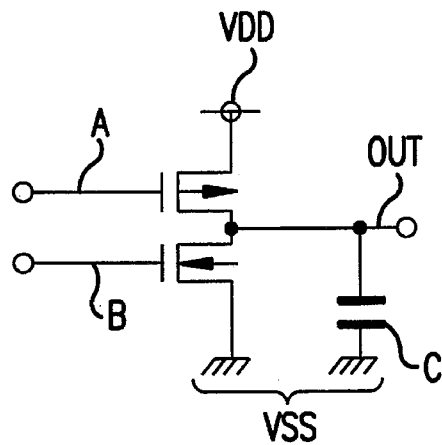
FIG. 2 is a diagram of a first main portion of the oscillator circuit shown in FIG. 1.

Before describing the operation of the present example, the operation of the dynamic latch circuits is described. The configuration has been described in relation to the first and second dynamic latch circuits 8 and 9, respectively. As shown in FIG. 2, the P-channel MOS transistor and the N-channel MOS transistor are connected in series between the power supply terminal VDD (e.g., 5 V) and the power supply terminal VSS (0 V). The gates of the P- and N-channel MOS transistors are used as input terminals A and B, respectively. An output terminal OUT is connected to the junction of these two MOS transistors. Parasitic capacitance formed by the gate capacitance or the like is expressed as capacitive element C, for convenience, and is connected to the output terminal OUT.

Figure 3A:
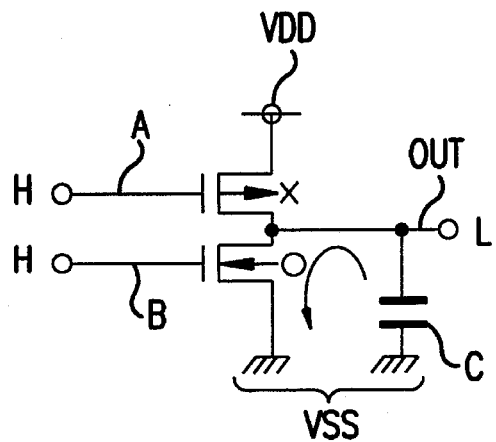
FIGS. 3(a)–3(d) are diagrams illustrating the operation of the portion shown in FIG. 2.

The operation is next described. In FIGS. 3(a)–3(d), H and L indicate states of voltages at each terminal. Circles (O) and crosses (x) indicate that each MOS transistor is in ON and OFF states, respectively. As shown in FIG. 3(a), if voltage H is applied to both input terminals A and B, only the N-channel MOS transistor is turned on. The capacitive element C is electrically discharged and so the voltage at the output terminal OUT goes low (L).

Figure 3B:
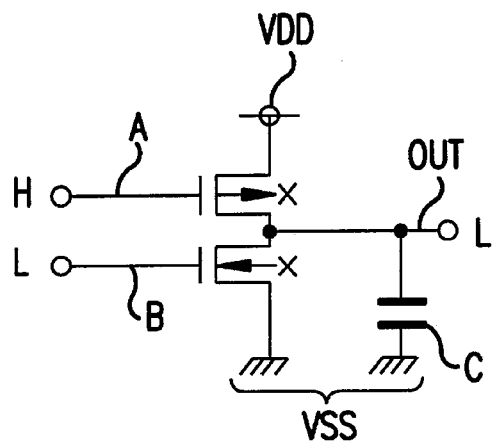

Under this condition, if voltage L is applied to the input terminal B as shown in FIG. 3(b), then P- and N-channel MOS transistors are both turned off. Electric charge is not moved out of the capacitive element C. The voltage at the output terminal OUT is retained, or latched, at L.

In practice, this state is brought close to a balanced potential by the leakage current. That is, this is a dynamic state. If this movement is much slower than the next change caused in response to the input, then the output can be regarded as being latched.

Figure 3C:
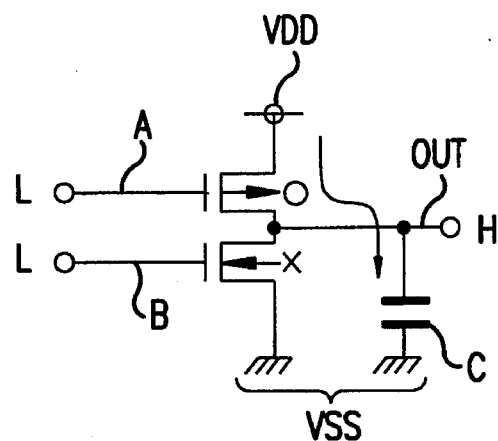

Then, as shown in FIG. 3(c), if voltage L is applied to the input terminal A, the P-channel MOS transistor turns on. The capacitive element C is electrically charged via this conducting MOS transistor. The voltage at the output terminal OUT goes high (H).

Figure 3D:
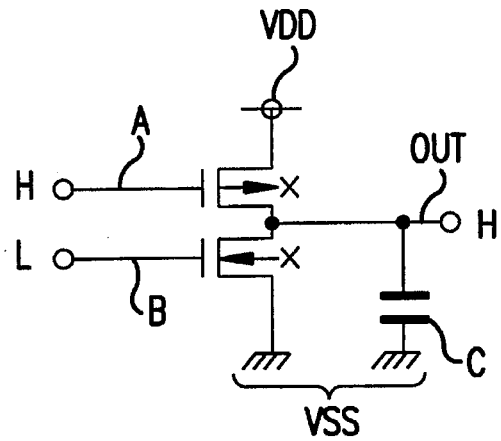

Subsequently, as shown in FIG. 3(d), if voltage H is applied to the input terminal A, the P-channel MOS transistor turns off. Also at this time, no electric charge moves out of the capacitive element C. The voltage at the output terminal OUT is retained, or latched, at H.

If voltage H is subsequently applied to the input terminal B, the N-channel MOS transistor turns on. The capacitive element C is discharged via this conducting MOS transistor. That is, the circuit returns to the state shown in FIG. 3(a). Subsequently, the first and second dynamic latch circuits repeat the operations shown in FIGS. 3(a)–3(d).

The configuration in which a plurality of transistors are connected in series between a power supply and an output terminal is omitted by the use of these dynamic latch circuits. As a consequence, higher-speed operation and lower power voltage operation are enabled.

Figure 4:
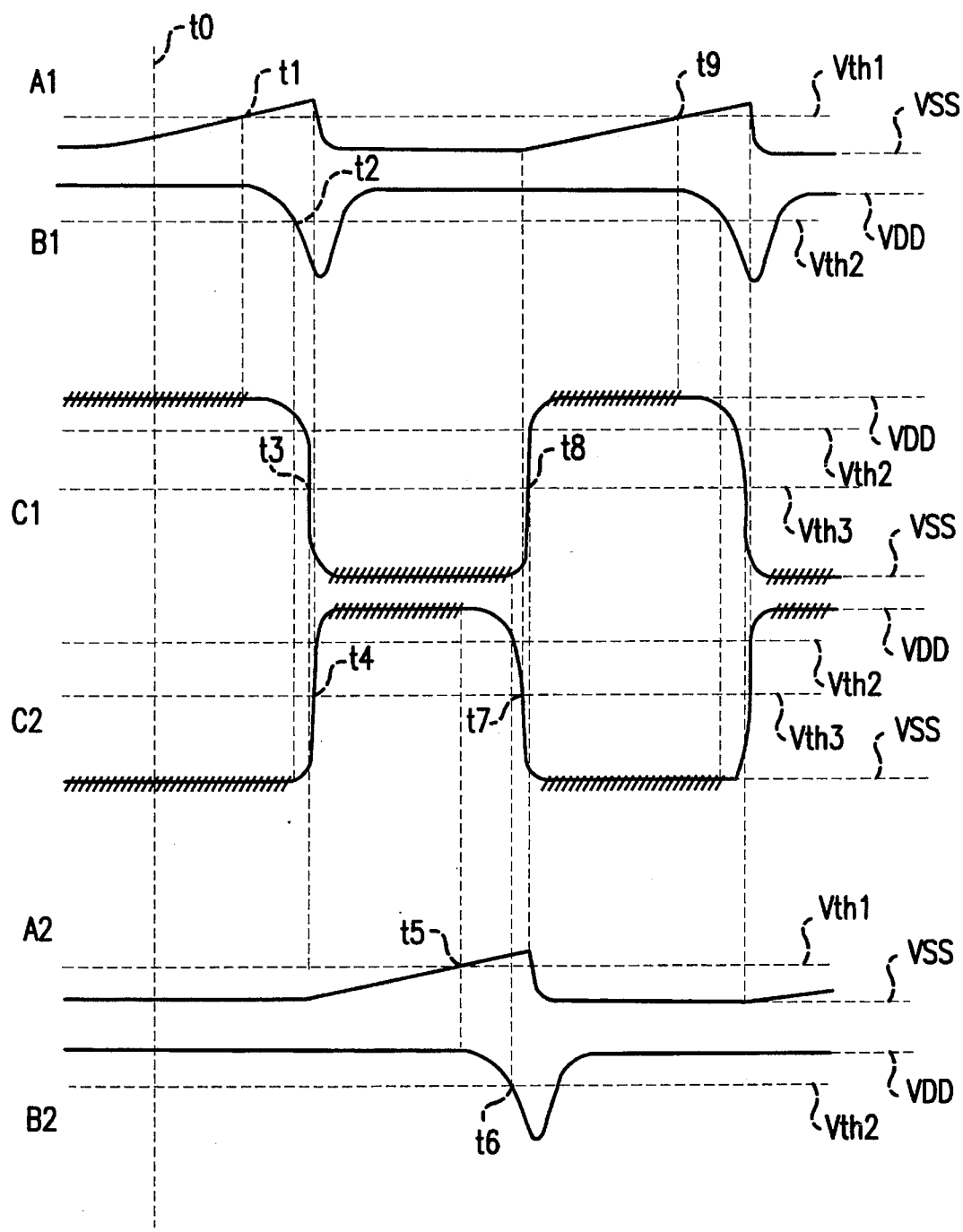
FIG. 4 is a waveform diagram illustrating the operation of the voltage-controlled oscillator circuit shown in FIG. 1.
Figure 5A:
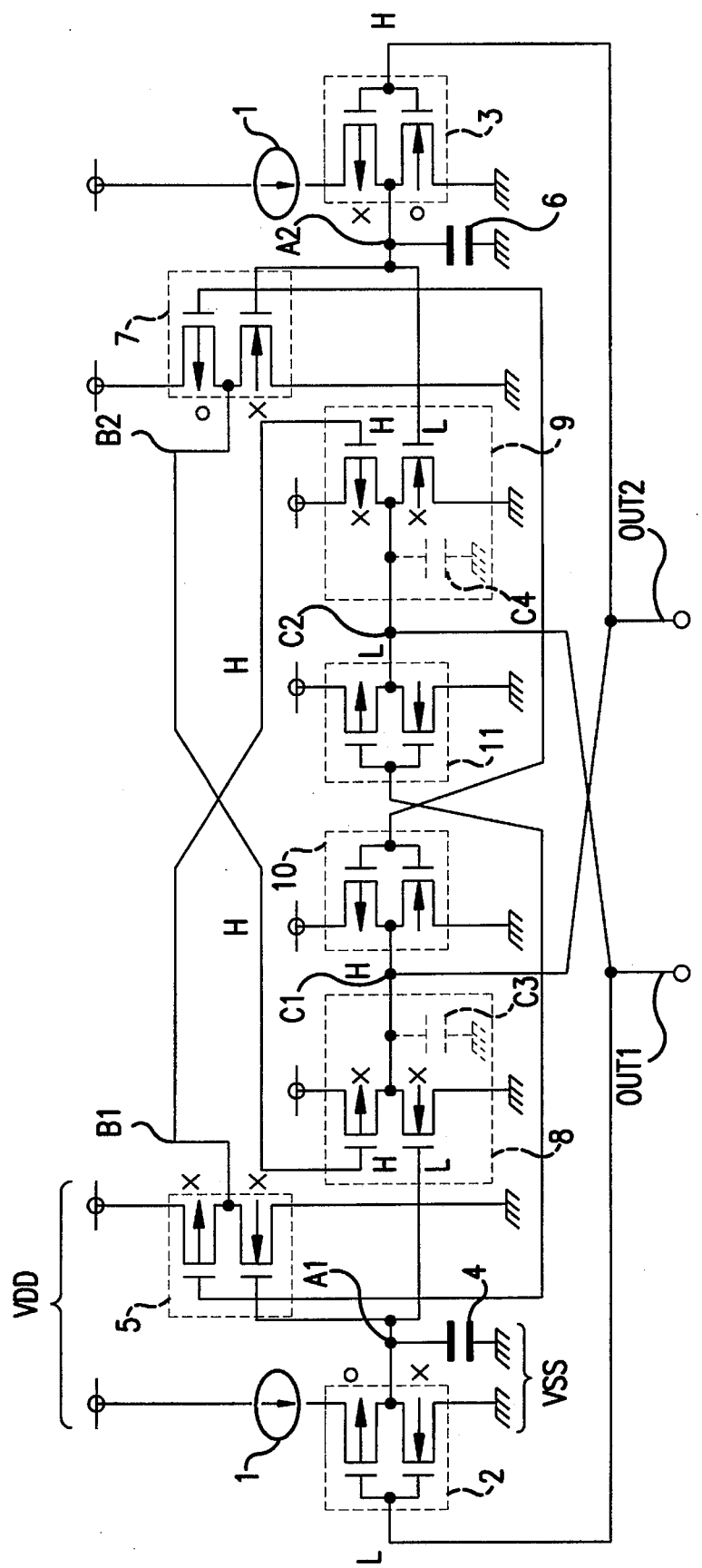
FIGS. 5(a) and 5(b) are circuit diagrams, illustrating the operation of the voltage-controlled oscillator circuit shown in FIG. 1.
Figure 5B:
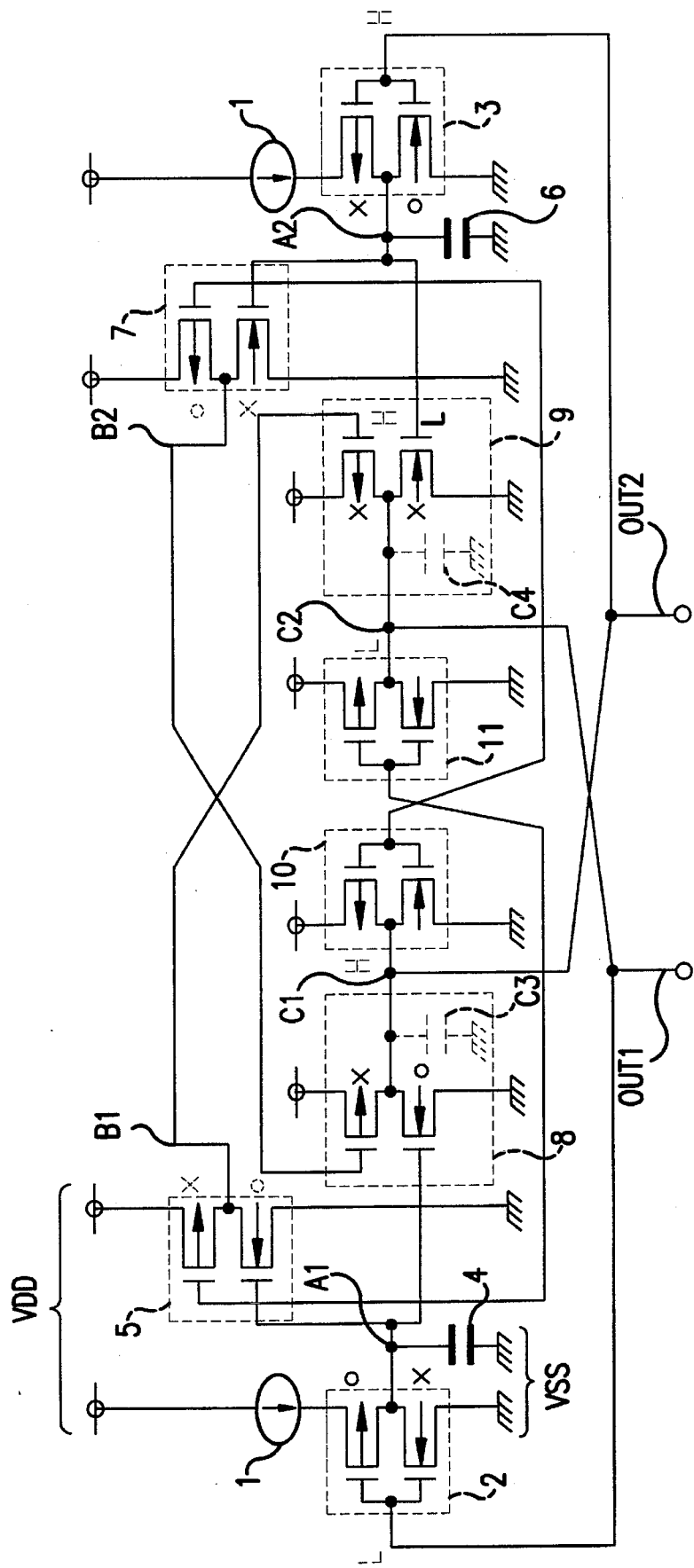

The operation of the present example is described below by referring to FIGS. 4, 5(a), 5(b), 6(a), and 6(b). FIG. 4 is a waveform diagram showing the states of the voltages at various terminals. FIGS. 5(a) and 5(b) show the states of the voltages at various terminals at the instants of time shown in FIG. 4. FIGS. 5(a) and 5(b) also indicate whether each MOS transistor is on or off. In FIGS. 5(a), 5(b), 6(a), and 6(b), H and L indicate the states of voltages at each terminal. Circles (O) and crosses (x) indicate that each MOS transistor are in ON and OFF states, respectively.

At the instant of time t0 shown in FIG. 4, a terminal A1 is in state L as shown in FIG. 5(a). Terminals C1 and C2 which are the output terminals OUT2 and OUT1, respectively, are in states H and L, respectively. The first and second dynamic circuits dynamically latch states H and L, respectively. Expressed corresponding to a flip-flop, set and reset states are respectively latched. For convenience, the dynamically latched states are indicated by the hatching on the waveforms C1 and C2 in FIG. 4. However, in the present example, the CMOS inverters are connected in parallel in mutually opposite senses between the two dynamic latch circuits and, therefore, it can be said that the state is static even on the hatched portions. In the first CMOS inverter 2, the N-channel MOS transistor is off, while the P-channel MOS transistor is on. The first capacitive element 4 is electrically charged. The P-channel MOS transistor of the second CMOS inverter 3 is off, whereas the N-channel MOS transistor is on. The second capacitive element 6 is being discharged.

At instant of time t1, the first capacitive element 4 is charged, and the voltage at the terminal A1 exceeds the threshold value Vth1 of the N-channel MOS transistor. At this instant, as shown in FIG. 5(b), the first comparator circuit 5 and the N-channel MOS transistor of the first dynamic latch circuit 8 turn on. The voltage at the terminals B1 and C1 begin to drop. H indicated by the broken line in FIG. 5(b) indicates that the voltage at each terminal to which the H is attached begins to change from state H to state L. Conversely, L indicated by the broken line indicates that the voltage at each terminal to which the L is attached begins to change from state L to state H. Symbols given to the following figures indicate similar states.

At instant of time t2, the output from the first comparator circuit 5, i.e., the voltage at the terminal B1, drops. The voltage at the terminal B1 as viewed from the power supply terminal VDD becomes lower than the threshold value Vth2 of the P-channel MOS transistor. In response to this, the P-channel MOS transistor of the second dynamic latch circuit 9 starts to conduct, and the voltage at the terminal C2 begins to rise.

The two CMOS inverters 10 and 11 are inserted between the output terminals of the first and second dynamic latch circuits 8 and 9, respectively. These inverters accelerate variations of the voltages at the terminals C1 and C2. Consequently, the outputs from the first and second dynamic latch circuits 8 and 9 go low (L) and high (H), respectively.

Figure 6A:
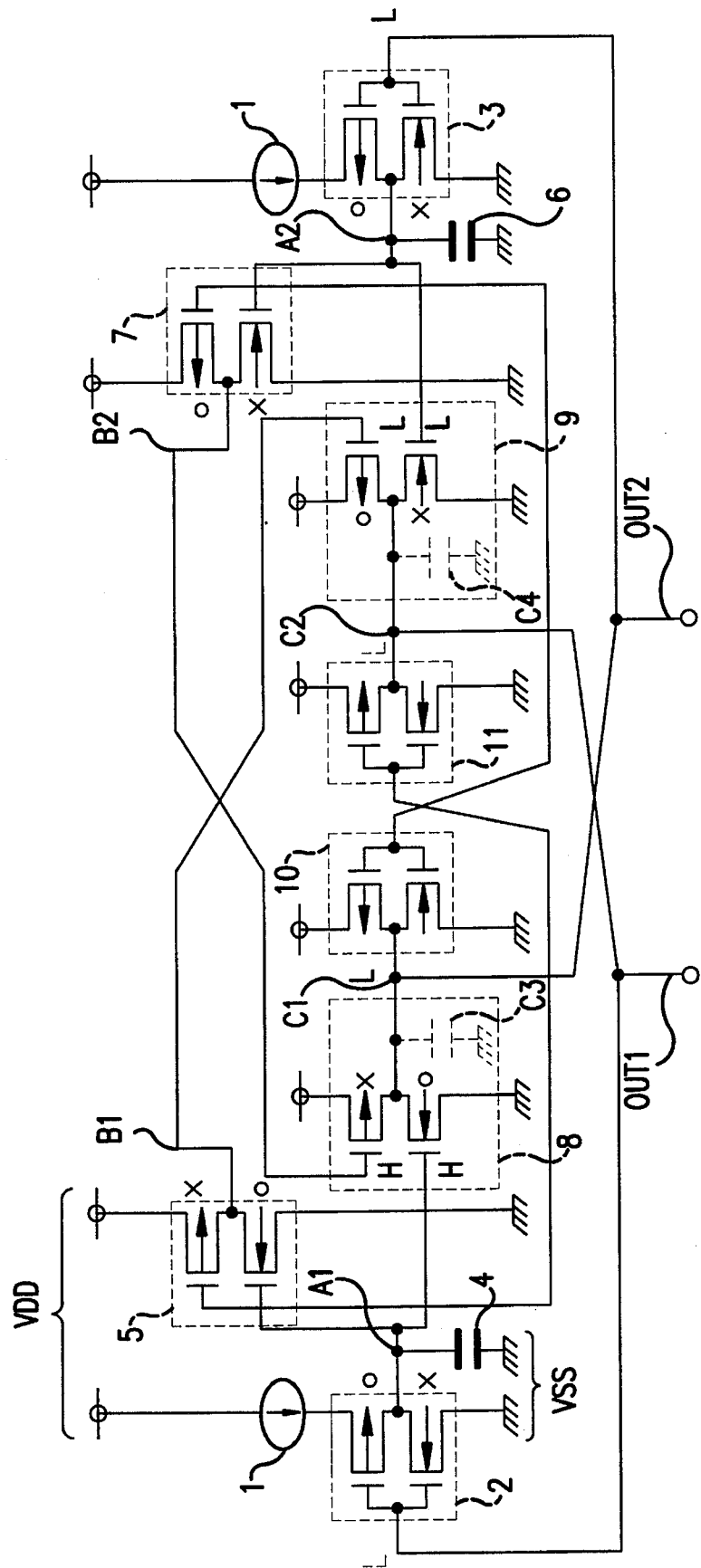
FIGS. 6(a) and 6(b) are circuit diagrams, illustrating the operation of the voltage-controlled oscillator circuit shown in FIG. 1.

At instant of time t3, if the output from the first dynamic latch circuit 8, i.e., the voltage at the terminal C1, becomes lower than the threshold value Vth3 of the CMOS inverters, then the N-channel MOS transistor of the second CMOS inverter 3 is turned off, while the P-channel MOS transistor turns on, as shown in FIG. 6(a). It is to be noted the threshold voltages satisfy the relations Vth1<Vth3<(VDD−|Vth2|). Hence, the second capacitive element 6 starts to be electrically charged.

Figure 6B:
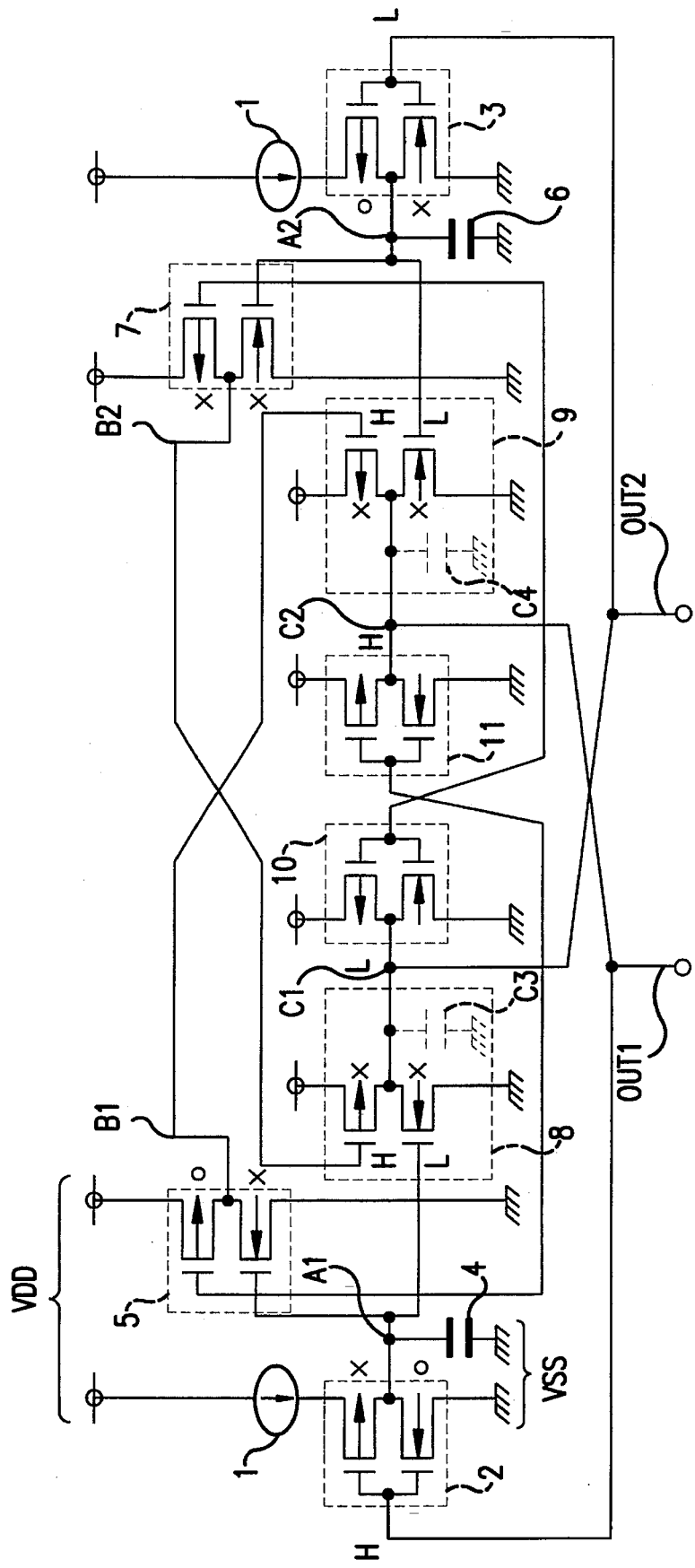

At instant of time t4, the output from the second dynamic latch circuit 9, i.e., the voltage at the terminal C2, exceeds the threshold value Vth3. In response to this, as shown in FIG. 6(b), the P-channel MOS transistor of the first CMOS inverter 2 is turned off, while the N-channel MOS transistor is turned on. The first capacitive element 4 is electrically discharged. The voltage at the terminal A1 drops. Then, the N-channel MOS transistor of the first comparator circuit 5 turns off. The output from the first comparator circuit 5, i.e., the voltage at the terminal B1, rises. The voltage at the terminal C1 as viewed from the power supply terminal VDD has already become lower than the threshold voltage Vth2. In response to this, the P-channel MOS transistor of the first comparator circuit 5 turns on, thus suppressing decrease in the voltage at the terminal B1. Rather, the voltage begins to rise. When the voltage at the terminal B1 subsequently goes high (H), the first and second dynamic latch circuits 8 and 9, respectively, dynamically latch the output states as mentioned previously.

The states at the various terminals shown in FIG. 6(b) have a mirror-image relationship to the states shown in FIG. 5(a). Then, the terminals experience the states shown in FIGS. 5(b) and 6(a) which have a mirror-image relation to each other. Thereafter, the terminals go back to the state shown in FIG. 5(a). That is, these operations are carried out while interchanging the symmetrical left and right circuits (e.g., the first CMOS inverter 2 and the second CMOS inverter 3) making a pair in FIG. 1. The operations are described in further detail below.

At instant of time t5, the second capacitive element 6 is electrically charged so that the voltage at the terminal A2 exceeds the threshold value Vth1. The N-channel MOS transistors of the second comparator circuit 7 and of the second dynamic latch circuit 9 turn on. The voltage at the terminal B2 and the voltage at the terminal C2 start to drop.

At instant of time t6, the output from the second comparator circuit 7, i.e., the voltage at the terminal B2 as viewed from the power supply terminal VDD, becomes lower than the threshold value Vth2. In response to this, the P-channel MOS transistor of the first dynamic latch circuit 8 begins to conduct, and the voltage at the terminal C1 starts to rise. Variations of the voltages at the terminals C1 and C2 are accelerated by the CMOS inverters 10 and 12. As a result, the outputs from the first and second dynamic latch circuits 8 and 9 go high (H) and low (L), respectively.

At instant of time t7, the output from the second dynamic latch circuit 9 becomes lower than the threshold voltage Vth3. In the first CMOS inverter 2, the N-channel MOS transistor turns off, whereas the P-channel MOS transistor turns on. Thus, the first capacitive element 4 begins to be electrically charged.

At instant of time t8, the voltage at the terminal C1, i.e., the output from the first dynamic latch circuit 8, is H and applied to the second CMOS inverter 3. The P-channel MOS transistor of the second CMOS inverter 3 turns off, whereas the N-channel MOS transistor turns on. This causes the second capacitive element 6 to be electrically discharged. The voltage at the terminal A2 decreases. This turns off the N-channel MOS transistor of the second comparator circuit 7. The output from the second comparator circuit 7, i.e., the voltage at the terminal B2, rises. Subsequently, the voltage at the terminal B1 goes high (H). As a result, the first and second dynamic latch circuits 8 and 9, respectively, dynamically latch the output states.

At instant of time t9, the first capacitive element 4 is electrically charged, so that the voltage at the terminal A1 becomes higher than the threshold value Vth1. This means that the state at the instant t1 is regained. Subsequently, the operations described thus far are repeated. In this way, oscillation output as shown in C1 and C2 in FIG. 4 is produced across the terminals C1 and C2.

As described thus far, in the present example, the first and second capacitive elements 4 and 6, respectively, are alternately charged and discharged to invert the outputs from the first and second dynamic latch circuits 8 and 9, respectively. In this way, oscillation output is obtained. More specifically, if one capacitive element, e.g., the first capacitive element 4, is electrically charged up to the above-described threshold value, the dynamic latch circuit (in this case, the first dynamic latch circuit 8) connected with this capacitive element is reset. The voltage at the output terminal of the comparator circuit (in this case, the first comparator circuit) connected also with this capacitive element decreases from state H. The output voltage from this comparator circuit becomes lower than the threshold value Vth2 as viewed from the power supply terminal VDD. As a consequence, the other dynamic latch circuit (in this case, the second dynamic latch circuit 9) is set. Then, the other capacitive element (in this case, the second capacitive element 6) begins to be charged. As the other dynamic latch circuit is set, one capacitive element is discharged. Thus, one dynamic latch circuit latches the output. The voltage at the output terminal of one comparator circuit returns to state H. These operations are alternately carried out while interchanging the two circuits making a pair. In this manner, the first and second capacitive elements 4 and 6, respectively, are alternately charged and discharged.

As can be seen from the description provided thus far, in the present example, one of the two circuits making a pair performs an operation for making preparations for charging, while the other performs an operation for making preparations for discharging. In this way, the two operations are carried out concurrently. The introduced delay is substantially equal to the delay created by one circuit. The dynamic latch circuits are set and reset when the P- and N-channel MOS transistors are respectively turned on. The introduced delay corresponds to one stage of MOS transistor. Hence, higher response can be obtained than where a flip-flop is used. In the present example, a delay corresponding to one stage is introduced by one dynamic latch circuit (in this example, the first dynamic latch circuit 8) from the instant when charging is done up to the threshold value of one capacitive element (e.g., the first capacitive element 4) to the instant when the other capacitive element (in this example, the second capacitive element 6) begins to be electrically charged. For this reason, the present invention provides a higher oscillation frequency than a three-stage ring oscillator with a delay corresponding to two stages. The charging voltages for the first and second capacitive elements 4 and 6, respectively, are directly applied to the gates of the N-channel MOS transistors of the first and second dynamic latch circuits 8 and 9, respectively. Therefore, the circuits can have threshold values lower than those of normal CMOS inverters. Consequently, the time required for the charging can be shortened. This contributes to improvement in the operation speed of the circuitry. Also, the circuitry is little affected by variations in the power voltage, unlike the threshold values of the CMOS inverters. As a consequence, the circuitry is regulated against power supply noises.

The present example is of the double-capacitor type. The duty cycle can be controlled with greater ease than a three-stage ring oscillator similarly to the prior art configuration using a flip-flop.

In the prior art configuration using a flip-flop, the P-channel and N-channel MOS transistors of the NOR gate forming a flip-flop are simultaneously turned on at a certain instant of time. An electric current is induced between the power terminals. Hence, it has been difficult to suppress the electric power consumption. In the present example, the P- and N-channel MOS transistors forming the first and second dynamic latch circuits 8 and 9 are simultaneously off or only one is on. Any other state is not assumed. The size of the two CMOS inverters 10 and 11 for assisting the two dynamic latch circuits can be small. Therefore, the electric current produced between the power supply terminals VDD and VSS is suppressed. Consequently, the amount of electric power consumed can be reduced.

Figure 7:
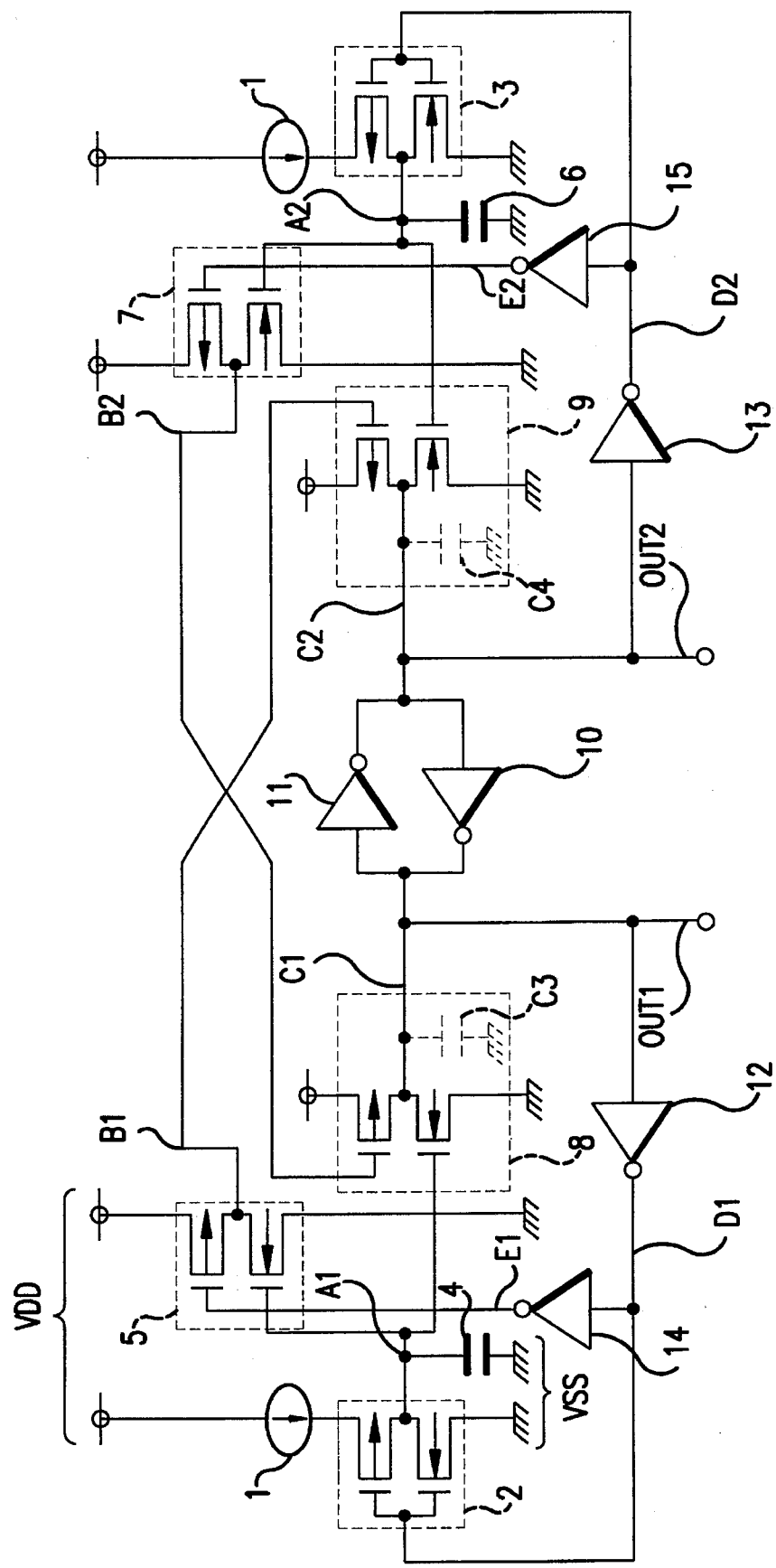
FIG. 7 is an electric circuit diagram of another voltage-controlled oscillator circuit according to the invention.

Another example of the present invention is next described. In the example described previously in connection with FIG. 1, the second and first CMOS inverters 3 and 2 are driven by the outputs from the first and second dynamic latch circuits 8 and 9, respectively. It is also possible to drive the first and second CMOS inverters 2 and 3 by the outputs from the first and second dynamic latch circuits 8 and 9, respectively, via inverters. In the present example, the circuitry is designed in this way. FIG. 7 is an electric circuit diagram showing the configuration of the present example. It is to be noted that like components are indicated by like reference numerals in various figures. In FIG. 7, indicated by 12–15 are CMOS inverters. The CMOS inverters 12 and 13 receive output signals from first and second dynamic latch circuits 8 and 9, respectively, and invert these output signals. The inverted signals are delivered to the first and second CMOS inverters 2 and 3, respectively. The CMOS inverters 14 and 15 receive outputs from the CMOS inverters 12 and 13, respectively, and deliver inverted signals to the gates of the P-channel MOS transistors of first and second comparator circuits 5 and 7, respectively. In this example, the CMOS inverters 12–15 have a threshold value equal to the above-described threshold value Vth3. The output terminal of the first dynamic latch circuit 8 is equipped with an output terminal Out1. The output terminal of the second dynamic latch circuit 9 is equipped with an output terminal Out2. Oscillation output is produced across the output terminals Out1 and Out2.

Figure 8:
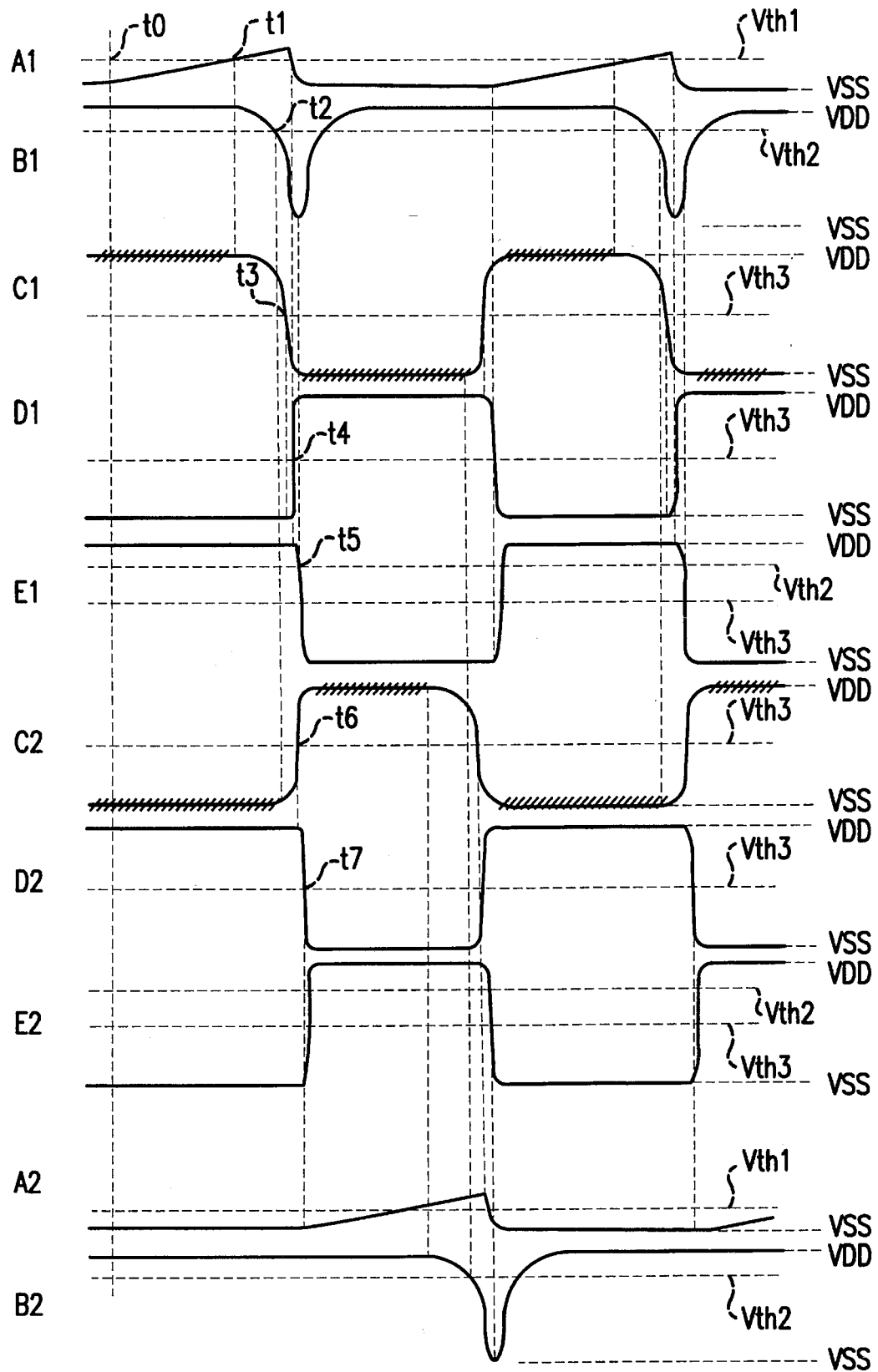
FIG. 8 is a waveform diagram illustrating the operation of the voltage-controlled oscillator circuit shown in FIG. 7.

The operation of the present example is described by referring to FIG. 8, which is a waveform diagram illustrating the states of voltages at various terminals shown in FIG. 7, in the same way as the description of the first-mentioned example illustrated in FIG. 1.

Referring to FIG. 8, at the instant t0, the terminal A1 is in state L (low). The terminals C1 and C2 are in states H and L, respectively. The first and second dynamic latch circuits dynamically latch states H and L, respectively.

At the instant t1, the first capacitive element 4 is electrically charged, so that the voltage at the terminal A1 exceeds the threshold value Vth1 of the N-channel MOS transistor. This turns on the N-channel MOS transistors of the first comparator circuit 5 and of the first dynamic latch circuit 8. The voltages at the terminals B1 and C1 begin to drop.

At the instant t2, the voltage at the terminal B1 as viewed from the power supply terminal VDD becomes lower than the threshold value Vth2 of the P-channel MOS transistor, thus driving the P-channel MOS transistor of the second dynamic latch circuit 9 into conduction. Then, the output from the second dynamic latch circuit 9, or the voltage at the terminal C2, starts to increase.

At the instant t3, the voltage at the terminal C1 becomes lower than the voltage at the terminal C1, i.e., the threshold value Vth3. As a result, the output from the CMOS inverter 12, i.e., the voltage at the terminal D1, begins to rise.

At the instant t4, the output from the CMOS inverter 12, i.e., the voltage at the terminal D1, exceeds the threshold value Vth3. The P-channel MOS transistor of the first CMOS inverter 2 is turned off, while the N-channel MOS transistor is turned on. The first capacitive element 4 is electrically discharged. As a consequence, the voltage at the terminal A1 drops. When the voltage at the terminal A1 assumes state L, the N-channel MOS transistor of the first dynamic latch circuit 8 turns off. The first dynamic latch circuit 8 dynamically latches the output in state L. For convenience, this state is indicated by the hatching on the waveform C1 in FIG. 8. It is to be noted, however, in the present example, the CMOS inverters are connected in parallel in mutually opposite senses between the output terminals of the two dynamic latch circuits. Therefore, it can be said that the state is static even in the hatched portions.

At the instant t5, the output from the CMOS inverter 14 which is an inversion of the output from the CMOS inverter 12, i.e., the voltage at the terminal E1, becomes lower than the threshold value Vth2 and assumes state L. In response to this, the P-channel MOS transistor of the first comparator circuit 5 is turned on, so that the voltage at the terminal B1 begins to rise. Thereafter, the voltage at the terminal B1 goes high (H). As a result, the output from the second dynamic latch circuit 9 is dynamically latched. Again, for convenience, this state is indicated by the hatching on the waveform C2 in FIG. 8.

At the instant t6, the output from the second dynamic latch circuit 9, or the voltage at the terminal C2, exceeds the threshold value Vth3. In response to this, the output from the CMOS inverter 13, or the voltage at the terminal D2, begins to drop.

At the instant t7, the output from the CMOS inverter 13, or the voltage at the terminal D2, becomes lower than the threshold value Vth3. The N-channel MOS transistor of the second CMOS inverter 3 is turned off, while the P-channel MOS transistor is turned on. The second capacitive element 6 begins to be electrically charged. The voltage at the terminal A2 starts to rise.

Also in the present example, these operations are carried out while interchanging the two symmetrical circuits making a pair as shown in FIG. 7. At the following instants of time, the voltages at the various terminals take states as shown in FIG. 8. These will not be described in further detail below. In this manner, in the present example, the first and second capacitive elements 4 and 6, respectively, are alternately charged and discharged. Consequently, oscillation output is produced across the terminals C1 and C2.

Figure 9A:
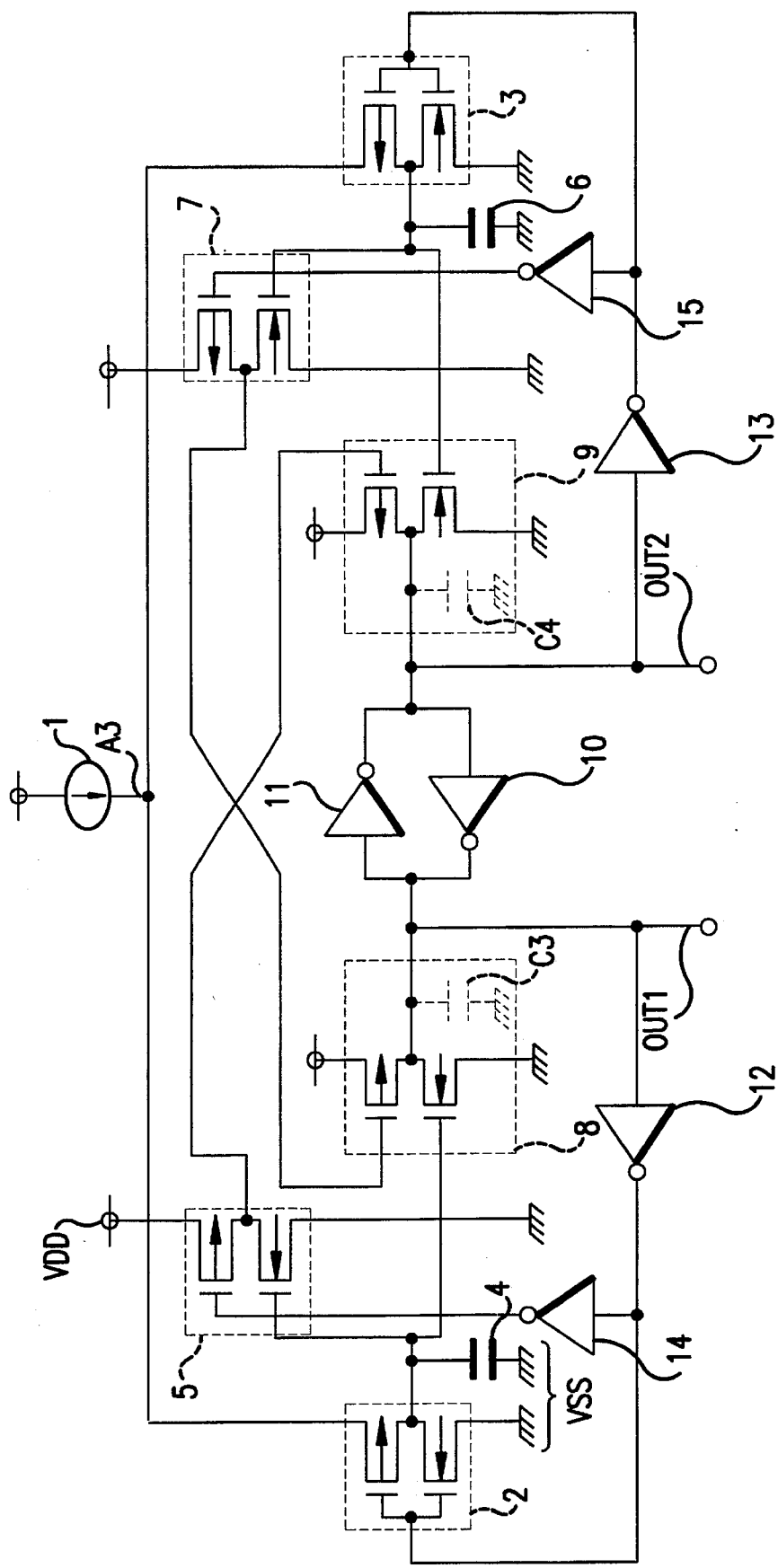
FIGS. 9(a)–9(c) are circuit diagrams of modifications of the voltage-controlled oscillator circuits shown in FIGS. 1 and 7.
Figure 9B:
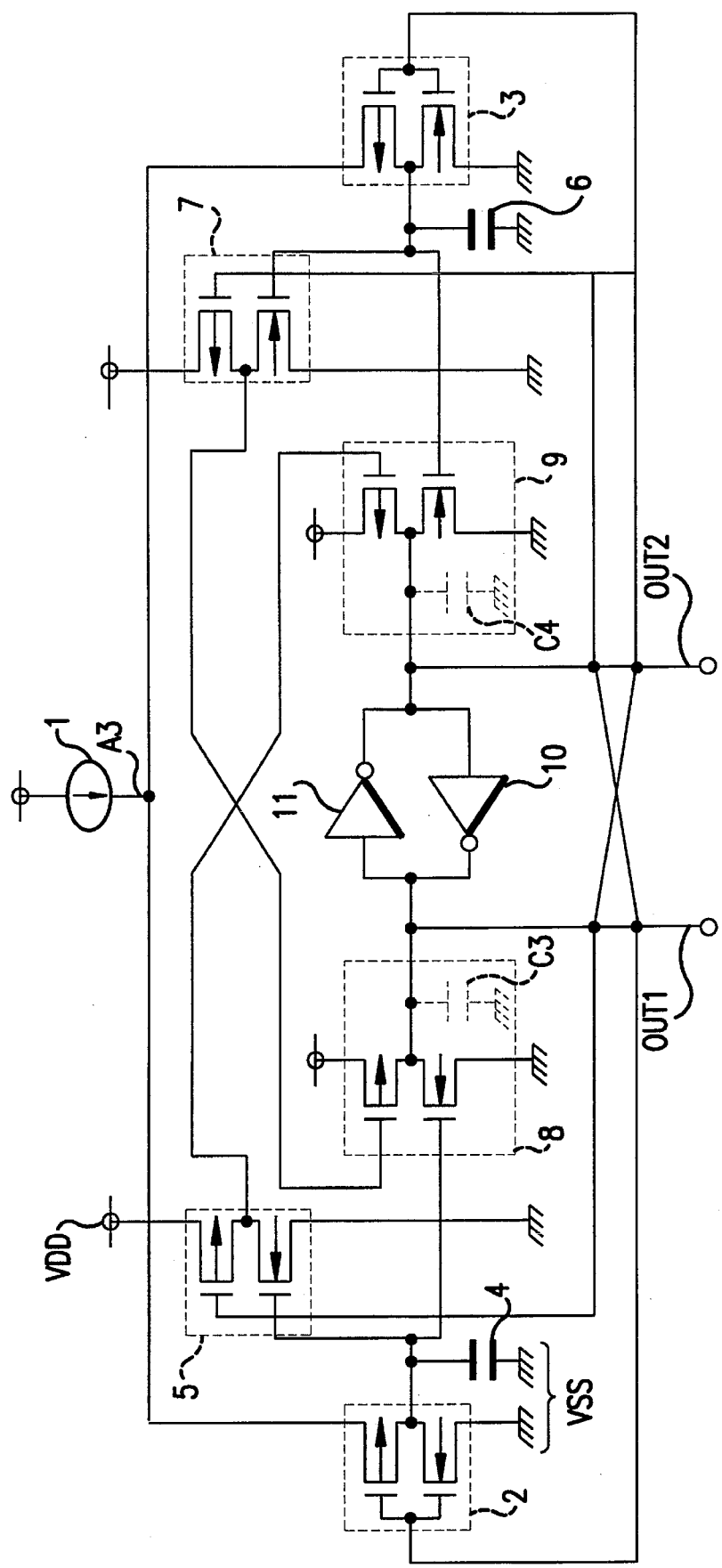
Figure 9C:
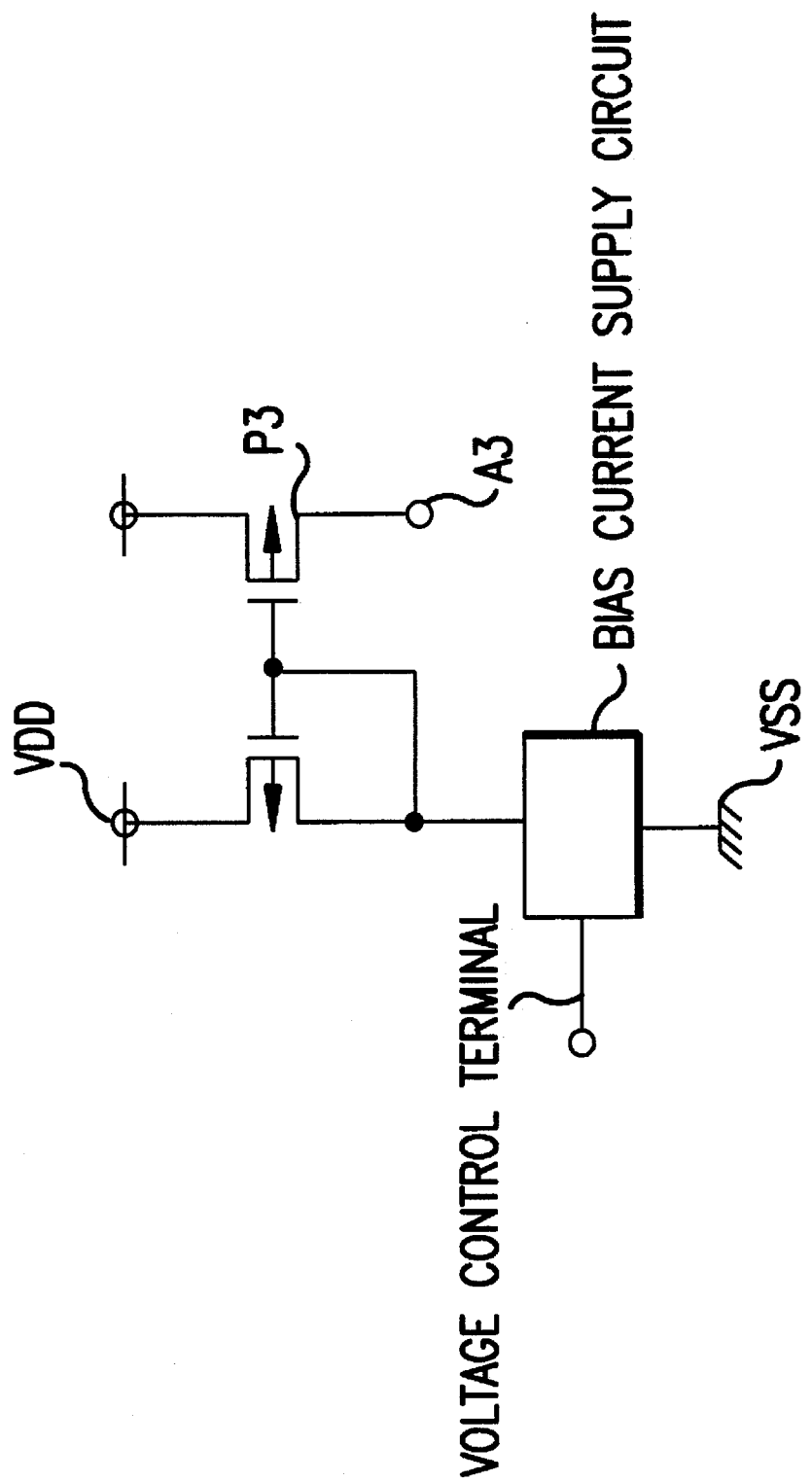

In the present example, after one capacitive element has been fully discharged, the other capacitive element begins to be charged. Therefore, as shown in FIG. 9(a), only one voltage-controlled current source 1 is necessary to electrically charge both capacitive elements. In this case, exactly the same electric current is supplied to the first and second CMOS inverters 2 and 3, respectively. This improves the symmetry of the circuitry. Also in the above example illustrated in FIG. 1, one voltage-controlled current source 1 can be shared by the two capacitive elements as shown in FIG. 9(b). In this case, at the beginning of the charging of the capacitive elements 4 and 6, the linearity of the rise of the potential is impaired but to the same extent for both capacitive elements 4 and 6. Hence, the symmetry is not deteriorated at all. Rather, the symmetry is improved, because one current source is shared by the capacitive elements. Furthermore, as shown in FIG. 9(c), one voltage-controlled current source 1 is shared by the two capacitive elements, and an electric current is kept supplied to the terminal A3. Therefore, a P-channel MOS transistor P3 shown in FIG. 9(c) invariably operates in a high-impedance state in the saturation region. This suppresses variations of the currents supplied to the first and second CMOS inverters 2 and 3 due to variations in the power voltage. As a consequence, frequency instability which would normally be caused by power voltage variations can be circumvented.

Figure 10A:
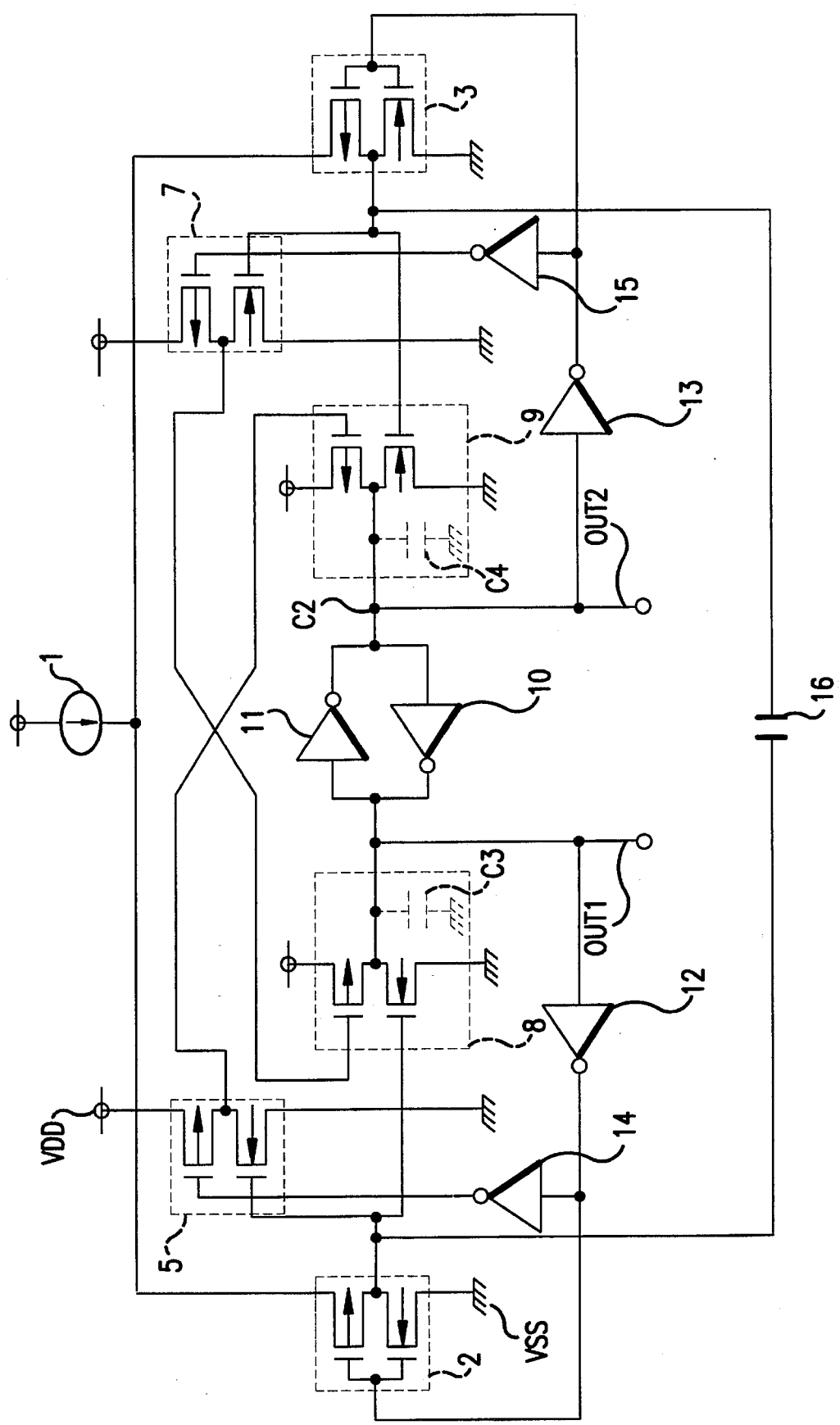
FIGS. 10(a)–10(b) are circuit diagrams of further modifications of the voltage-controlled oscillator circuits shown in FIGS. 1 and 7.
Figure 10B:
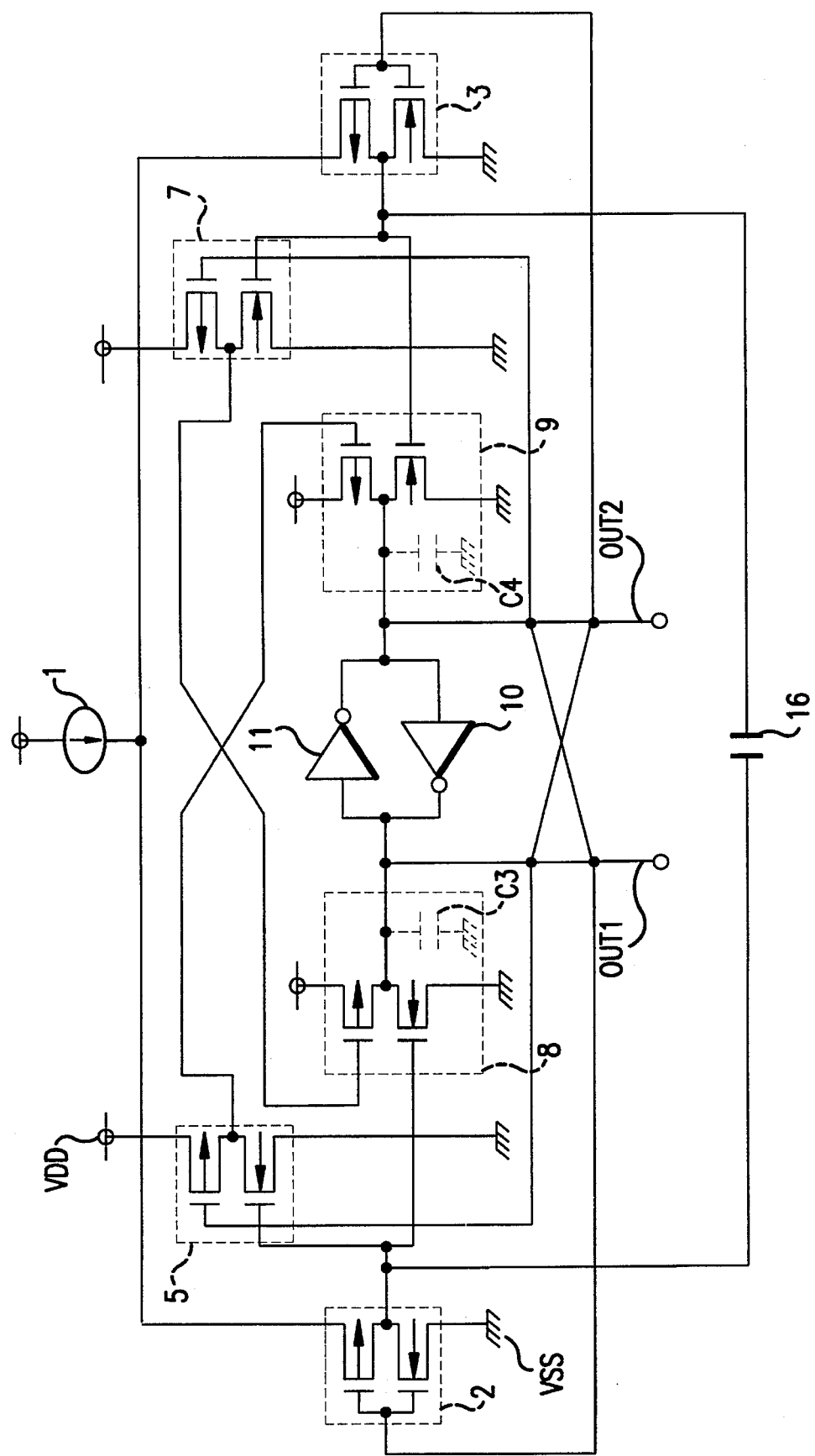

In the configurations shown in FIGS. 9(a) and 9(b), the capacitive elements 4 and 6 are alternately charged and discharged. One is not used while the other is being electrically charged. Based on this principle, the capacitive elements 4 and 6 can be combined into one capacitive element. The circuits shown in FIGS. 9(a) and 9(b) are modified in this way to fabricate circuits shown in FIGS. 10(a) and 10(b), where the capacitive elements 4 and 6 are omitted. Instead, a capacitive element 16 is connected between the output terminals of the first and second CMOS inverters 2 and 3, respectively. In the circuits shown in FIGS. 9(a) and 9(b), the two capacitive elements 4 and 6 are alternately charged and discharged. In the circuits shown in FIGS. 10(a) and 10(b), one capacitive element 16 is charged and discharged alternately in two opposite directions continuously. Except for this, the circuits shown in FIGS. 10(a) and 10(b) are similar to the circuits shown in FIGS. 9(a) and 9(b) in operation and advantages.

In the two examples described above, the two CMOS inverters 10 and 11 are connected in parallel in mutually opposite senses between the output terminal of the first dynamic latch circuit 8 and the output terminal of the second dynamic latch circuit 9. This is important in improving the stability of the oscillation as described below. It is desired to use the two CMOS inverters in conjunction with the dynamic latch circuits. More specifically, if the CMOS inverters 10 and 11 are omitted from the circuits of the two examples described above, oscillation at low frequencies may become unstable, because the CMOS inverters placed immediately after the first and second dynamic latch circuits 8 and 9, respectively, are both driven by one type of MOS transistors (i.e., either the P-channel MOS transistors or the N-channel MOS transistors) of the dynamic latch circuits 8 and 9. This is described in greater detail, taking as an example the circuit of the example illustrated in FIG. 7 from which the CMOS inverters 10 and 11 have been omitted.

Figure 11:
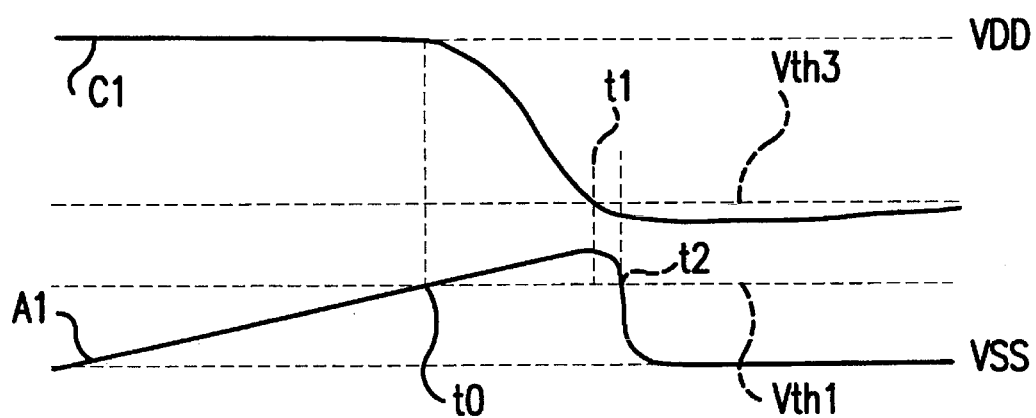
FIG. 11 is a waveform diagram illustrating the operation of main portions of the voltage-controlled oscillator circuit shown in FIG. 7.

A circuit which is similar to the circuit shown in FIG. 7 except that the CMOS inverters 10 and 11 are omitted has been built. The voltages at the terminals A1 and C2 at various instants of time are shown in FIG. 11. The operation of the circuit is now described by referring to FIG. 11.

At instant of time t0, the voltage at the terminal A1 exceeds the threshold value Vth1 of the N-channel MOS transistor. Then, the voltage at the terminal C1 decreases toward state L. However, if the rate at which the voltage at the terminal A1 increases is low, then the voltage at the terminal C1 varies also slowly, for the following reason. If the potential at the terminal C1 is close to the potential at the power supply terminal VDD, and if the voltage at the terminal A1 is slightly higher than the threshold value Vth1, then this N-channel MOS transistor operates in the saturation region. Since this saturation current value increases at a rate depending on the difference between the voltage at the terminal A1 and the threshold value Vth1, if the rate at which the voltage at the terminal A1 increases is low, i.e., if the voltage at the terminal A1 stays near the threshold value Vth1 for a long time, then the saturation current value is maintained at a low value. For this reason, it takes a long time to discharge the terminal C1 up to state L.

On the other hand, at the instant of t1, the voltage at the terminal C1 becomes lower than the threshold value Vth3 of the CMOS inverter 16. The P-channel MOS transistor of the CMOS inverter of the first CMOS inverter 2 is turned off, while the N-channel MOS transistor is turned on. In response to this, at the instant t2, the first capacitive element 4 is discharged. This is a CMOS operation, which is faster than the operation of a MOS transistor alone, for the following reason. When the voltage at the terminal C1 is equal to the threshold value Vth3 of the CMOS inverter, the P- and N-channel MOS transistors forming this inverter are in their saturation regions. The threshold value Vth3 of the CMOS inverter is sufficiently remote from the threshold values of the transistors and so the saturation current values of both transistors are sufficiently larger than the saturation current values obtained when inputs slightly greater than the threshold values are applied to their respective transistors. At the threshold value Vth3, current values flowing through the P-channel and N-channel MOS transistors are balanced against each other. This makes it impossible to supply an electric current for charging or discharging the output terminal. If the voltage at the input terminal C1 varies across the threshold value Vth3, then one saturation current decreases but the other saturation current increases. Therefore, the balanced state is upset greatly. The difference between the currents acts to discharge or charge the output terminals and increases rapidly. Variations of the voltages at the output terminals progress rapidly. Since the CMOS inverter operates in response to variations in the voltage at the terminal C1, the voltage at the terminal A1 decreases below the threshold value of the N-channel MOS transistor. Consequently, the voltage at the terminal C1 may not be fully settled in state L until this transistor is just turned off. At this time, the voltage at the terminal C1 is not latched in full low (L) state. As the rate at which the first capacitive element 4 is charged decreases, the voltage at the terminal C1 decreases at a lower rate. Therefore, the voltage at the terminal C1 which is lower than the threshold value of the CMOS inverter 16 is brought closer to the threshold value with lowering frequency. As a result, there is the possibility that the output from the CMOS inverter 16 is inverted by noises.

Accordingly, it is desired that the voltages at the output terminals of the first and second dynamic latch circuits 8 and 9, respectively, vary at high speeds and with certainty by detecting the variations in the outputs from the dynamic latch circuits 8 and 9 and inserting a CMOS inverter loop between the output terminals, the loop acting to amplify the variations between the output terminals. That is, the CMOS inverters 10 and 11 are connected in parallel in mutually opposite senses between the output terminals of the dynamic latch circuits 8 and 9. For example, if the terminal C1 is started to be discharged by the N-channel MOS transistor of the first dynamic latch circuit 8, and if the voltage varies across the threshold value vth3, then the CMOS inverter 10 begins to charge the terminal C2 rapidly. This assists the P-channel MOS transistor of the second dynamic latch circuit 9 in charging the terminal C2, the second dynamic latch circuit 9 receiving the output from the first comparator circuit 5. Also, the discharging of the terminal C1 itself is accelerated via the CMOS inverter 11. In this manner, the CMOS inverters 10 and 11 act to accelerate mutual variations. Hence, the outputs from the dynamic latch circuits are accelerated.

Figure 12:
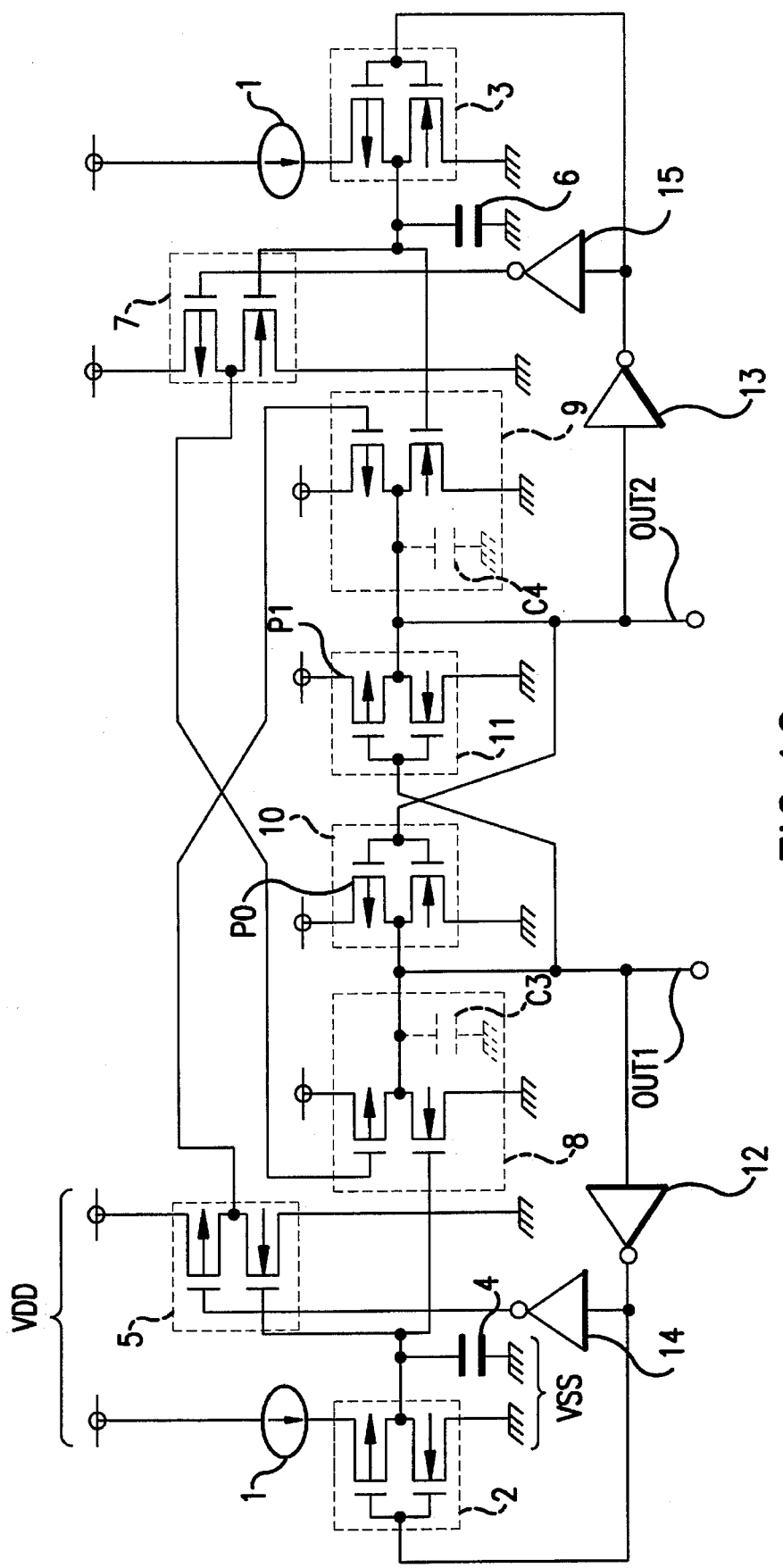
FIG. 12 is a circuit diagram illustrating the operation of main portions of the voltage-controlled oscillator circuit shown in FIG. 7.

If a transition to a dynamic latch state should be made when the dynamic latch circuits are varying the outputs, then the CMOS inverters 10 and 11 continue to operate, thus bringing the terminals C1 and C2 into full L or H state. Hence, the possibility that malfunction is induced by noises is eliminated. At this time, logically, the P-channel MOS transistors of the first and second comparators 5 and 7, respectively, and of the first and second dynamic latch circuits 8 and 9, respectively, are not necessary. However, if the P-channel MOS transistors for driving the terminals C1 and C2 are only P-channel MOS transistors P0 and P1, then their size must be increased to secure sufficient buffer performance. As can be seen from FIG. 12, the P-channel MOS transistor P0 turns off immediately after the N-channel MOS transistor of the first dynamic latch circuit 8 is turned on. This increases the current passing through it. On the other hand, the P-channel MOS transistors of the first and second dynamic latch circuits 8 and 9 are turned off before the N-channel MOS transistors are turned on. Hence, such current does not flow. Where these facts are taken into account, it is desirable to reduce the size of the transistors forming the CMOS inverters 10 and 11 while leaving the P-channel MOS transistors of the dynamic latch circuits 8 and 9 as they are. This can suppress the current passing through them. The rate at which the outputs from the first and second dynamic latch circuits 8 and 9 drop can be increased. As a result, oscillation at low frequencies stabilizes.

As can be understood from the description provided thus far, it is desired to connect the two CMOS inverters 10 and 11 in parallel in mutually opposite senses between the output terminals of the two dynamic latch circuits 8 and 9.

Figure 13:
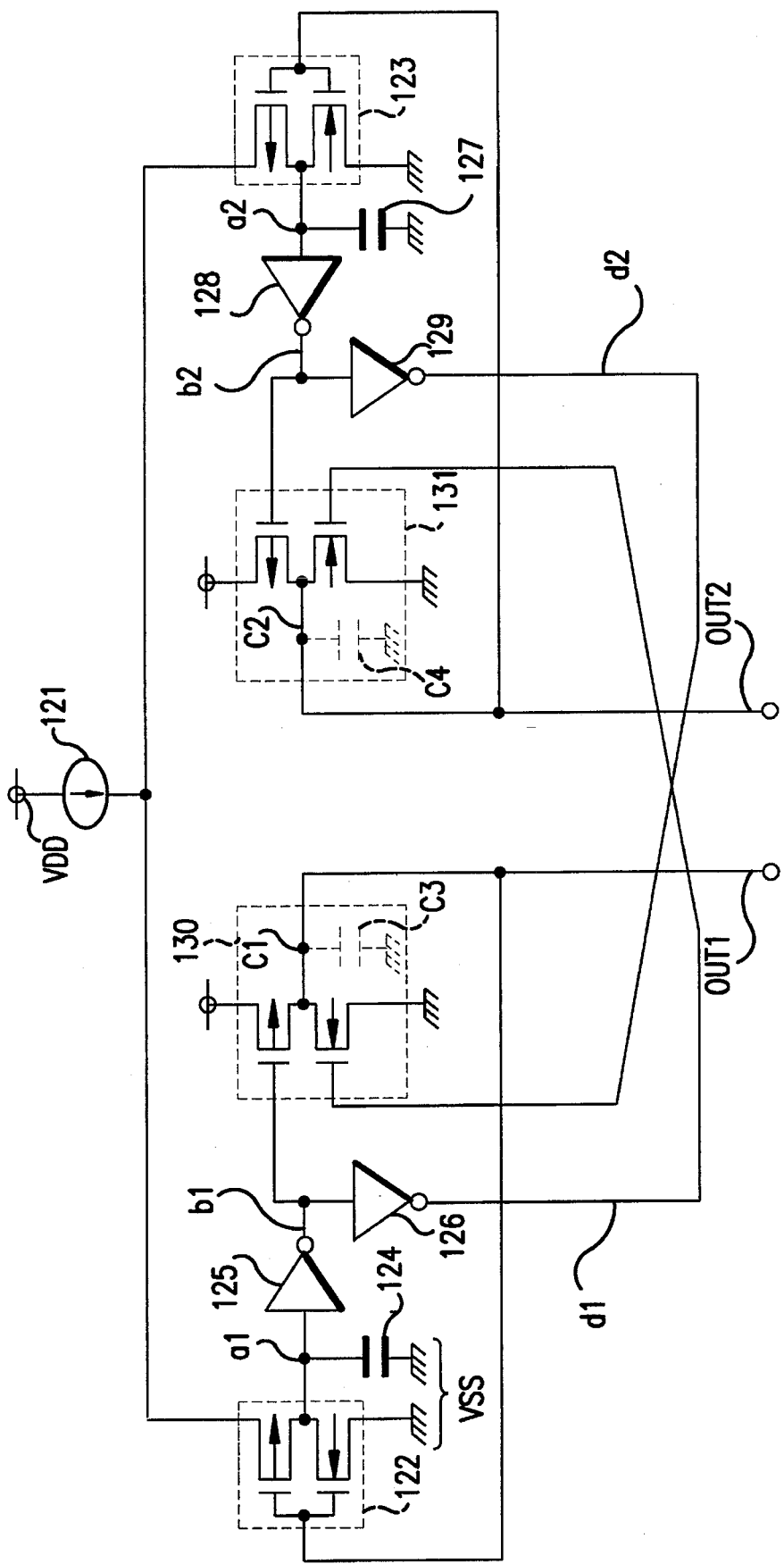
FIG. 13 is an electric circuit diagram of a further voltage-controlled oscillator circuit according to the invention.

A further example of the present invention is next described by referring to FIG. 13. A voltage-controlled current source 121 acts as a current source and is similar to the current sources of the above examples.

A first CMOS inverter 122 and a second CMOS inverter 123 have P-channel MOS transistors whose source electrodes are connected to the voltage-controlled current source 121. The source electrodes of the N-channel MOS transistors are connected to a power supply terminal VSS.

A first capacitive element 124 has one terminal connected with the output terminal of the first CMOS inverter 122, the other terminal being connected to the power supply terminal VSS. The first capacitive element 124 is electrically charged by an electric current from the voltage-controlled current source 121 via the P-channel MOS transistor of the first CMOS inverter 122. The first capacitive element 124 is electrically discharged via the N-channel MOS transistor of the inverter 122. A parasitic capacitance such as a gate capacitance may be used as the first capacitive element.

A first comparator circuit 125 consists of a CMOS inverter and has an input terminal connected with the first capacitive element 124. The output from the first comparator circuit 125 varies from state H to state L when the charging voltage for the capacitive element 124 exceeds a reference voltage, i.e., its threshold value. A third CMOS inverter 126 receives the output from the first comparator circuit 125.

A second capacitive element 127 has one terminal connected with the output terminal of the second CMOS inverter 123, the other terminal being connected with the power supply terminal VSS. The second capacitive element 127 is electrically charged by an electric current from the voltage-controlled current source 121 via the P-channel MOS transistor of the second CMOS inverter 123. The second capacitive element 127 is discharged via the N-channel MOS transistor. A parasitic capacitance such as a gate capacitance may be used as the second capacitive element.

A second comparator circuit 128 consists of a CMOS inverter and has an input terminal connected with the second capacitive element 127. The output from the second comparator circuit 128 varies from state H to state L when the charging voltage for the capacitive element 127 exceeds a reference voltage, i.e., its threshold value. A fourth CMOS inverter 129 receives the output from the second comparator circuit 128.

A first dynamic latch circuit 130 consists of a P-channel MOS transistor and an N-channel MOS transistor which are connected in series, in the same way as in the above examples. An output terminal is connected to the junction of these two transistors. The output from the first comparator circuit 125 is applied to the gate of the P-channel MOS transistor. The output from the fourth CMOS inverter 129 is applied to the gate of the N-channel MOS transistor. The output from the first dynamic latch circuit 130 is produced to the input terminal of the second CMOS inverter 123. The output terminal has a parasitic capacitance as consisting of the gate capacitance of the MOS transistor connected to the following stage. For convenience, this is expressed as a capacitive element C3, in the same manner as in the above examples.

A second dynamic latch circuit 131 consists of a P-channel MOS transistor and an N-channel MOS transistor which are connected in series, in the same way as in the above examples. An output terminal is connected to the junction of these two transistors. The output from the second comparator circuit 128 is applied to the gate of the P-channel MOS transistor. The output from the third CMOS inverter 126 is applied to the gate of the N-channel MOS transistor. The output from the second dynamic latch circuit 131 is produced to the input terminal of the first CMOS inverter 122. The output terminal has a parasitic capacitance as consisting of the gate capacitance of the MOS transistor connected to the following stage. For convenience, this is expressed as a capacitive element C4.

The input terminal of the first CMOS inverter 122 is equipped with an output terminal out1. Similarly, the input terminal of the second CMOS inverter 123 is equipped with an output terminal out2. Oscillation output is produced across the output terminals out1 and out2.

Figure 14:
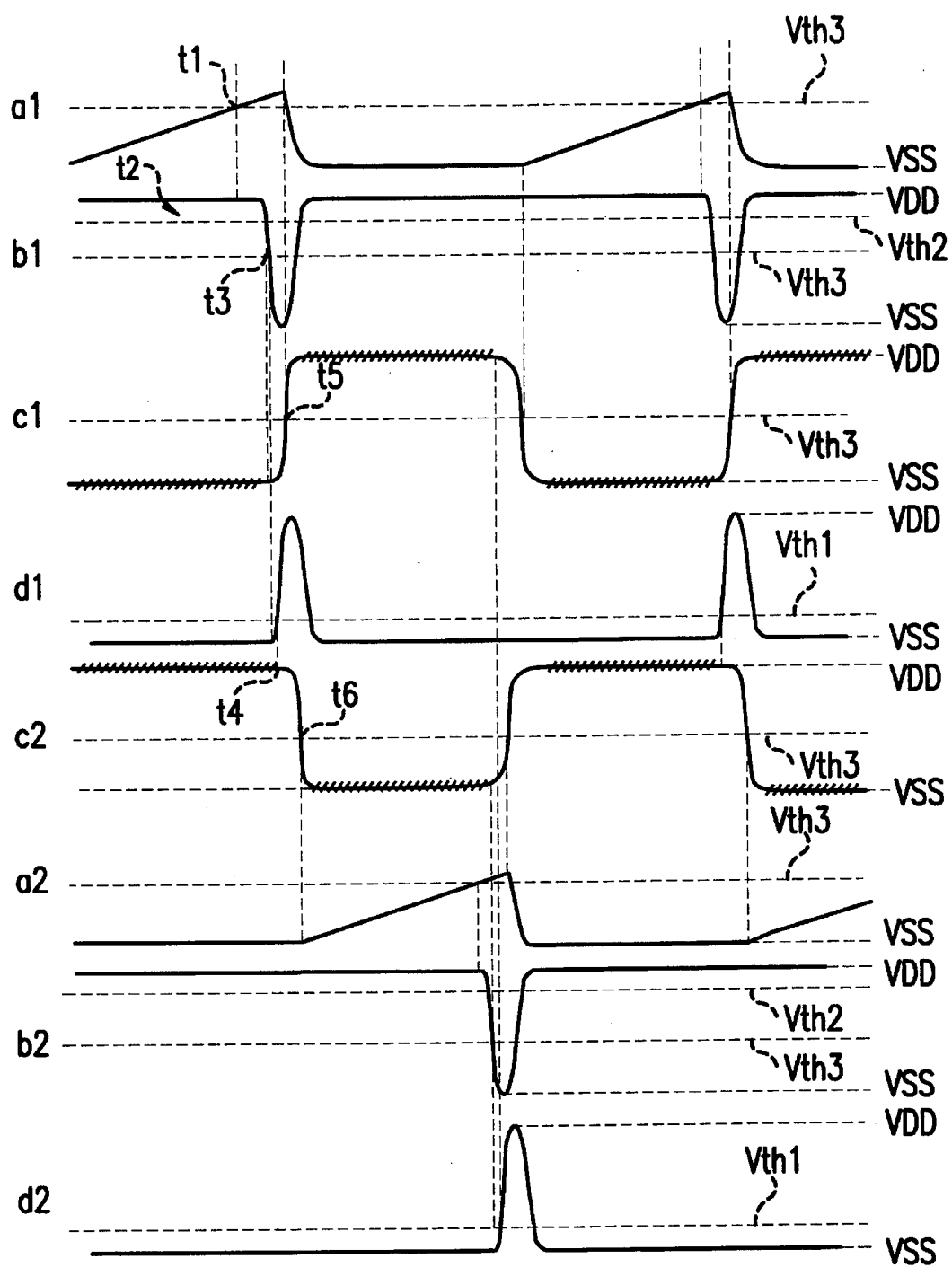
FIG. 14 is a waveform diagram illustrating the operation of the voltage-controlled oscillator circuit shown in FIG. 13.

The operation of the present example is next described by referring to the waveform of FIG. 14 which shows the states of voltages at various terminals shown in FIG. 13.

Referring to FIG. 14, at instant of time t0, terminal a1 is in state L. Terminals c1 and c2 are in states L and H, respectively.

At instant t1, the first capacitive element 124 is electrically charged so that the voltage at the terminal a1 exceeds the threshold value Vth3 of the CMOS inverter. Thus, the output from the first comparator circuit 125, i.e., the voltage at the terminal b1, begins to drop.

At instant t2, the voltage at the terminal b1 as viewed from the power voltage terminal VDD becomes lower than the threshold value Vth2 of the P-channel MOS transistor. This turns on the P-channel MOS transistor of the first dynamic latch circuit 130. The voltage at the terminal c1 commences to rise.

At instant t3, the voltage at the terminal b1 decreases below the threshold value Vth3. The voltage at the output terminal of the third CMOS inverter, i.e., the voltage at the terminal d1, begins to increase.

At instant t4, the output from the third CMOS inverter 126, or the voltage at the terminal c1, exceeds the threshold value Vth1 of the N-channel MOS transistor. The N-channel MOS transistor of the second dynamic latch circuit 131 begins to conduct. The voltage at the terminal c2 starts to drop.

At instant t5, the output from the first dynamic latch circuit 130, or the voltage at the terminal c1, exceeds the threshold value Vth3. In response to this, the P-channel MOS transistor of the first CMOS inverter 122 turns off, while the N-channel MOS transistor turns on. The first capacitive element 124 starts to be electrically discharged. The voltage at the terminal a1 decreases.

When the voltage at the terminal a1 assumes state L, the output voltage from the first comparator circuit 125 rises. When the voltage at the terminal b1 takes state H, the P-channel MOS transistor of the first dynamic latch circuit 130 turns off. The output is dynamically latched. This state is indicated by the hatching on the waveform c1 in FIG. 14.

At instant t6, the output from the second dynamic latch circuit 131, or the voltage at the terminal c2, becomes lower than the threshold value Vth3. The P-channel MOS transistor of the second CMOS inverter 123 is turned on instead of the N-channel MOS transistor. The second capacitive element 127 is started to be charged. In response to a high (H) state at the terminal b1, the output voltage at the third CMOS inverter 126 drops, and the voltage at the terminal d1 assumes state L. In response to this, the N-channel MOS transistor of the second dynamic latch circuit 131 turns off. The second dynamic latch circuit 131 dynamically latches the output. This state is indicated by the hatching on the waveform c2 in FIG. 14.

Also in the present example, these operations are carried out while interchanging the two symmetrical circuits making a pair as shown in FIG. 13. At the following instants of time, the voltages at the various terminals assume states as shown in FIG. 14. This will not be described in further detail below. Consequently, oscillation output indicated at c1 and c2 of FIG. 14 is produced across the terminals c1 and c2 by repeating these operations.

In this way, also in the present example, oscillation output is obtained by alternately charging and discharging the first and second capacitive elements 124 and 127, respectively. Stability of the oscillation can be enhanced as mentioned above by connecting the two CMOS inverters in series in mutually opposite senses between the output terminals of the first and second dynamic latch circuits.

Figure 15:
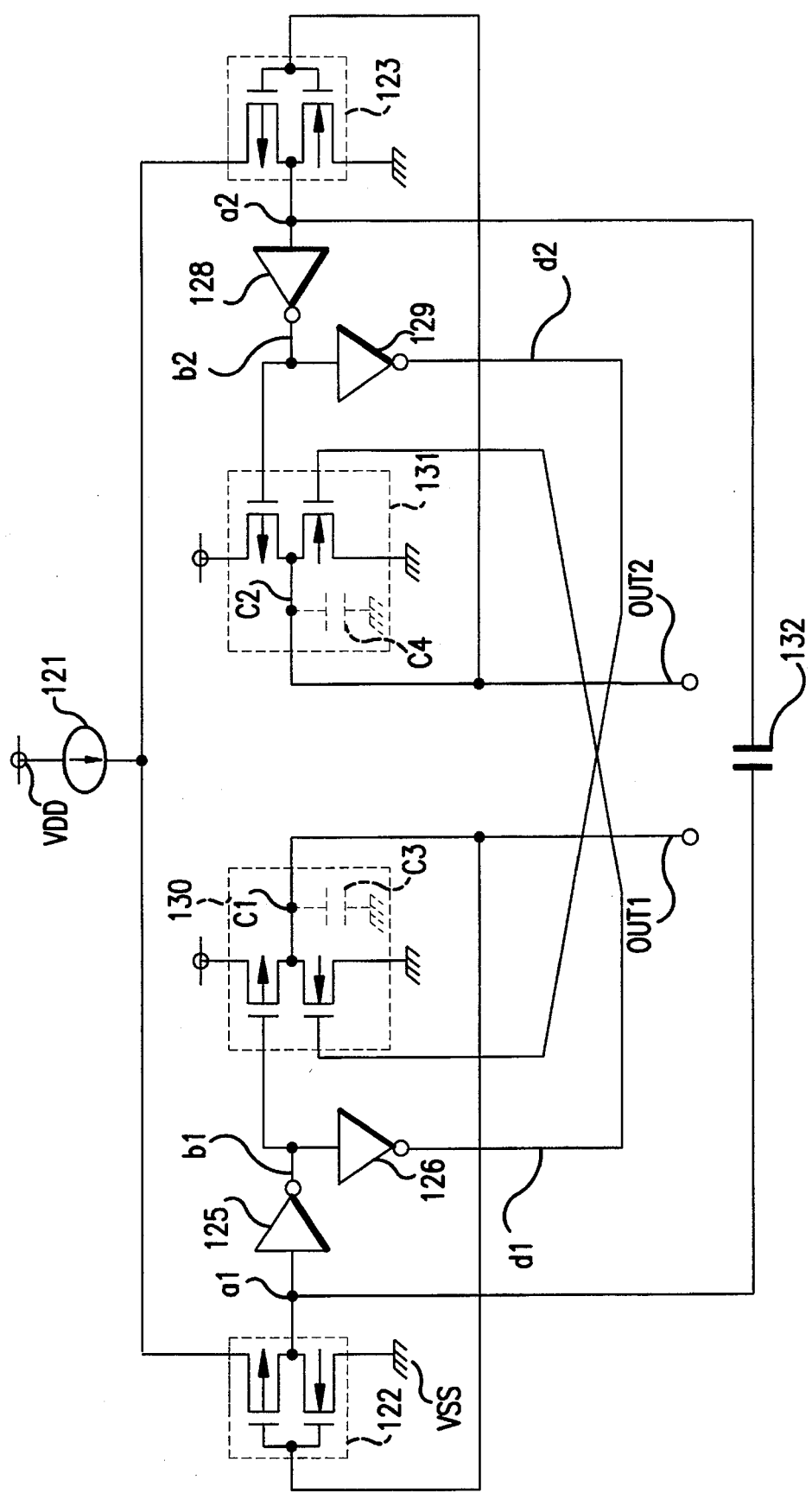
FIG. 15 is a circuit diagram of a modification of the voltage-controlled oscillator circuit shown in FIG. 13.

Also in the present example, after one capacitive element has been fully discharged, the other capacitive element begins to be charged. Therefore, as shown in FIG. 13, only one voltage-controlled current source 1 is necessary to electrically charge both capacitive elements. That is, the current source 1 is shared by both capacitive elements. This improves the symmetry of the circuitry. The symmetry can be further enhanced by combining the capacitive elements 124 and 127 into one capacitive element. Specifically, as shown in FIG. 15, the capacitive elements 124 and 127 are omitted, and a capacitive element 132 is inserted between the output terminals of the two CMOS inverters 122 and 123. Where the capacitive elements 124 and 127 are included, they are alternately charged and discharged. In the circuit of FIG. 15, charging and discharging are continuously done with the capacitive element 132. Except for this, the circuit shown in FIG. 15 is similar to the circuit shown in FIG. 13 in operation and advantages.

Figure 16:
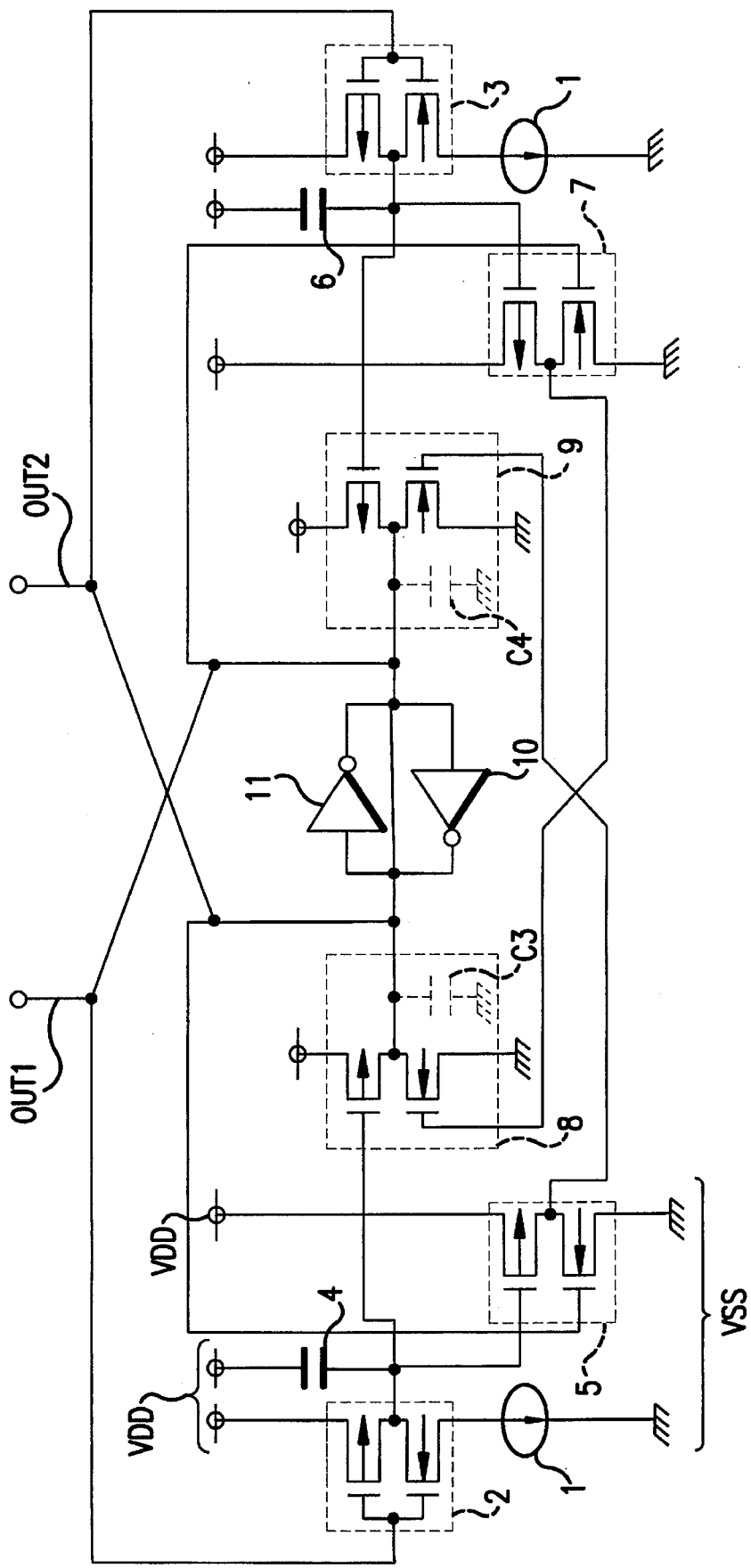
FIG. 16 is a circuit diagram of a further modification of the voltage-controlled oscillator circuit shown in FIG. 1.
Figure 17A:
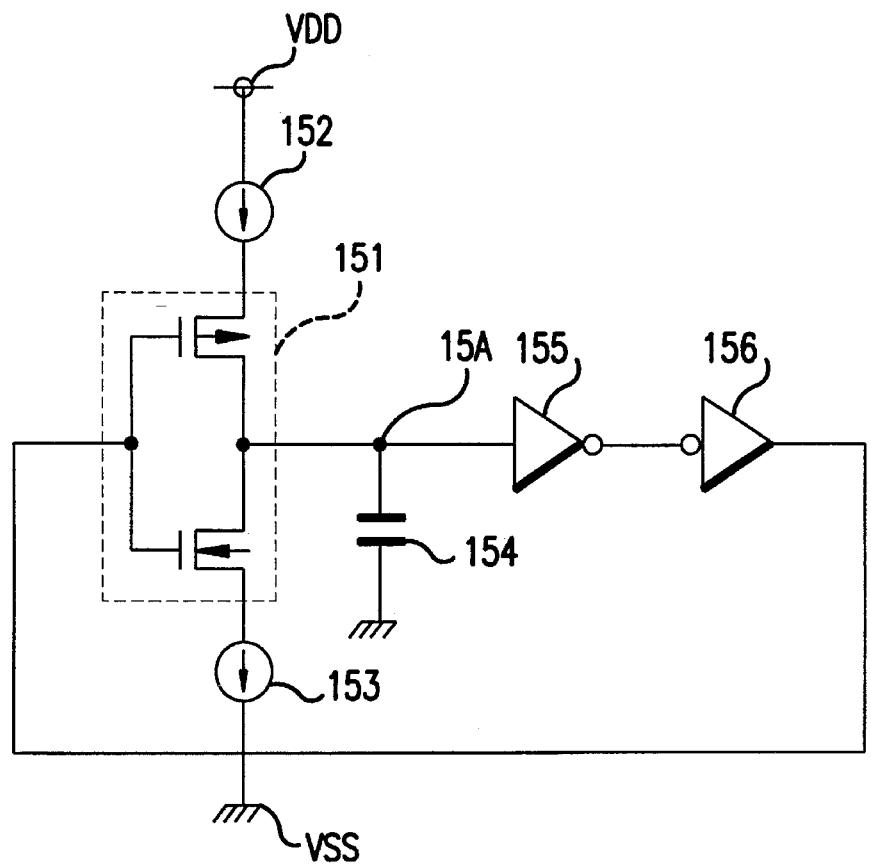
FIG. 17(a) is a circuit diagram of a conventional voltage-controlled oscillator circuit.
Figure 17B:
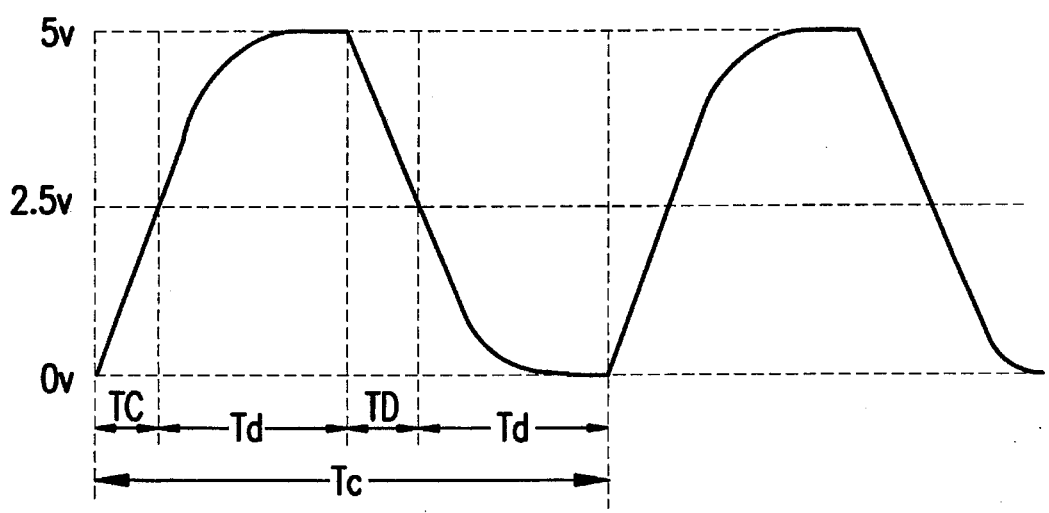
FIG. 17(b) is a waveform diagram illustrating the operation of the conventional voltage-controlled oscillator circuit shown in FIG. 17(a)
Figure 18A:
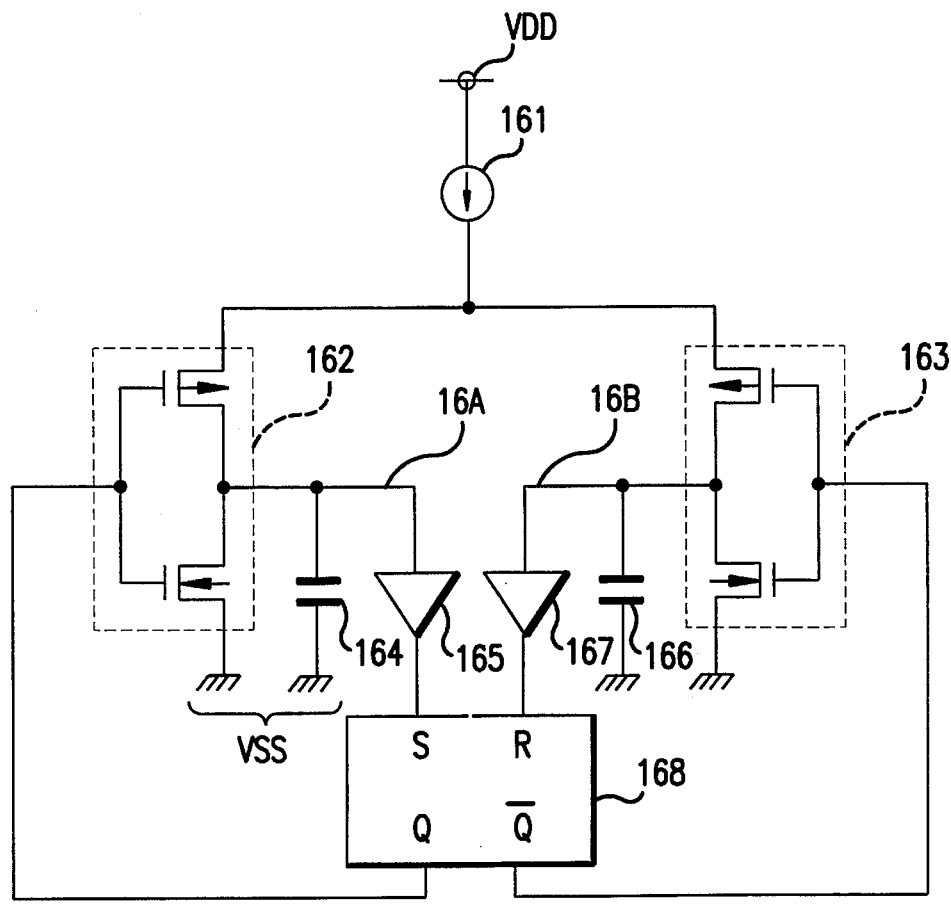
FIG. 18(a) is a circuit diagram of a known voltage-controlled oscillator circuit.
Figure 18B:
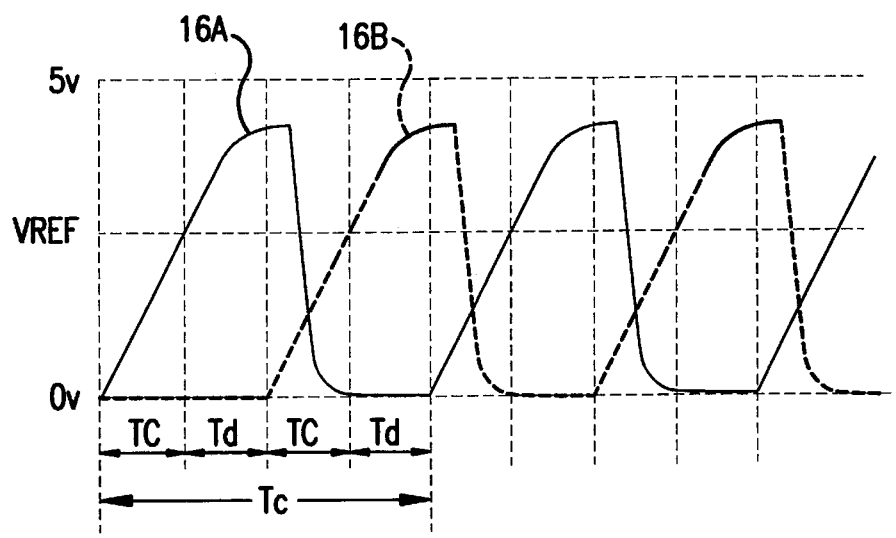
FIG. 18(b) is a waveform diagram illustrating the operation of the knownvoltage-controlled oscillator circuit shown in FIG. 18(a)
Figure 19A:
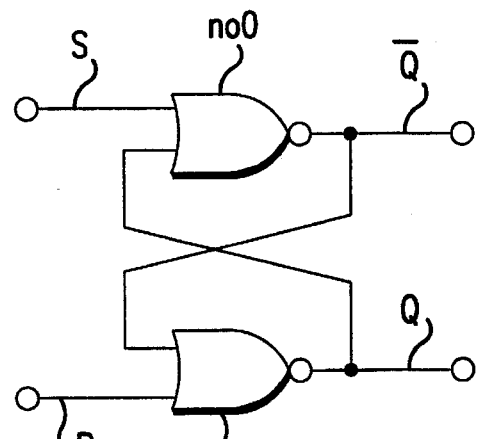
FIG. 19(a) is a circuit diagram of a conventional logic circuit.
Figure 19B:
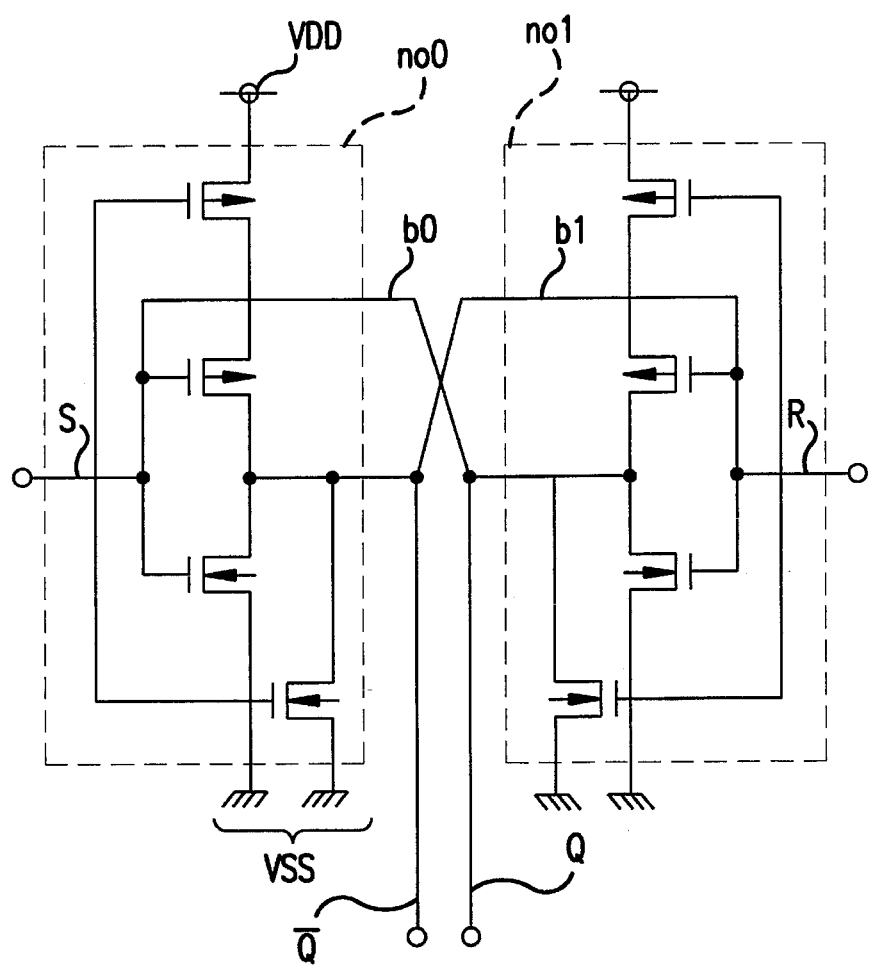
FIG. 19(b) is an equivalent circuit diagram of the logic circuit shown in FIG. 19(a)

In the three examples described above, the voltage-controlled current source 1 is placed on the side of the power supply terminal VDD. The first and second capacitive elements 4 and 6 are positioned on the side of the power supply terminal VSS. Of course, the present invention is not limited to this arrangement. The voltage-controlled current source 1 may be connected on the side of the power supply terminal VSS. The first and second capacitive elements 4 and 6 may be disposed on the side of the power supply terminal VDD. If these modifications are added to the circuit shown in FIG. 1, then a circuit configuration as shown in FIG. 16 is obtained. It is to be noted that like components are indicated by like reference numerals in various figures. Since the circuit shown in FIG. 16 is similar to the circuit shown in FIG. 1 in operation, the circuit of FIG. 16 is described merely briefly. In the configuration shown in FIG. 16, the oscillation frequency is determined by establishing the voltage-controlled current source 1 and the rates at which the first and second capacitive elements 4 and 6 are discharged.

Figure 20A:
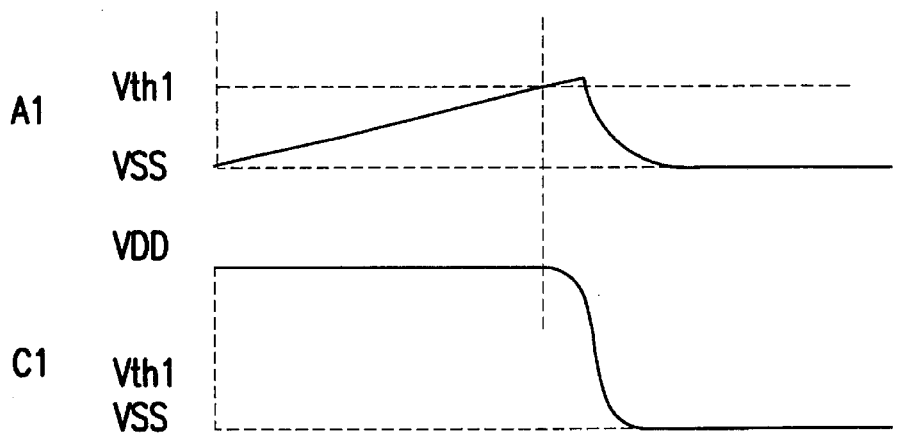
FIGS. 20(a)–20(c) are waveform diagrams illustrating the principle of operation of modifications of the voltage-controlled oscillator circuit shown in FIG. 1.
Figure 20B:
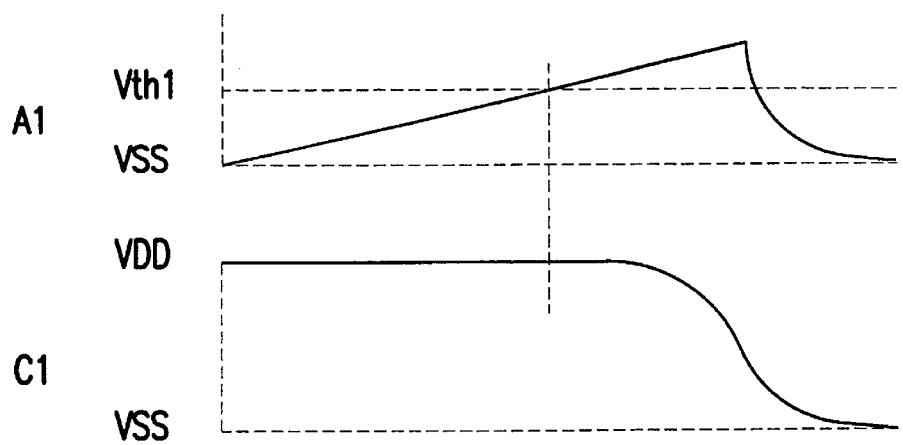

In the example already described in connection with FIG. 1, the charging voltages for the first and second capacitive elements 4 and 6 are applied to the gates of the N-channel MOS transistors of the dynamic latch circuits 8 and 9, respectively. When the charging voltage at the terminal A1 exceeds a given threshold value Vth1 as shown in FIG. 20(a), the N-channel MOS transistors turn on. The state of the terminal C1 shifts from state H to state L as indicated at C1 of FIG. 20(a). However, in practice, the variation is milder as shown in FIG. 20(b), for the following reason. The terminals B1 and C1 are discharged by the channel MOS transistors which have just turned on. At this time, the N-channel MOS transistors are saturated. The relation between the output (drain) current and the input voltage is given by (output current)∝[(input voltage)−Vth1]$^2$ Specifically, as the difference between the input voltage and the threshold voltage Vth1 increases, the terminals B1 and C1 are discharged more rapidly. However, any voltage-controlled oscillator circuit is required to have facilities for appropriately modifying the oscillation frequency. In some cases, it must be possible to lower the oscillation frequency. For example, if the rate at which the first capacitive element 4 is charged is reduced to lower the oscillation frequency, it takes a long time for the potential at the terminal A to go far off the threshold value Vth1. As a result, the circuit is susceptible to noises introduced to the terminal A1 for a long time. Furthermore, the voltages at the terminals B1 and C1 vary slow and so noises easily enter the input signal to the next stage. Therefore, if sufficient amplification cannot be performed by the next stage, there is a danger that oscillation operation comes to a stop.

Accordingly, in an attempt to solve these problems and to improve the operation stability further, first and second auxiliary charging circuits may be added. These auxiliary charging circuits accelerate the increases of the charging voltages when these charging voltages for the first and second capacitive elements exceed their reference voltages.

Figure 20C:
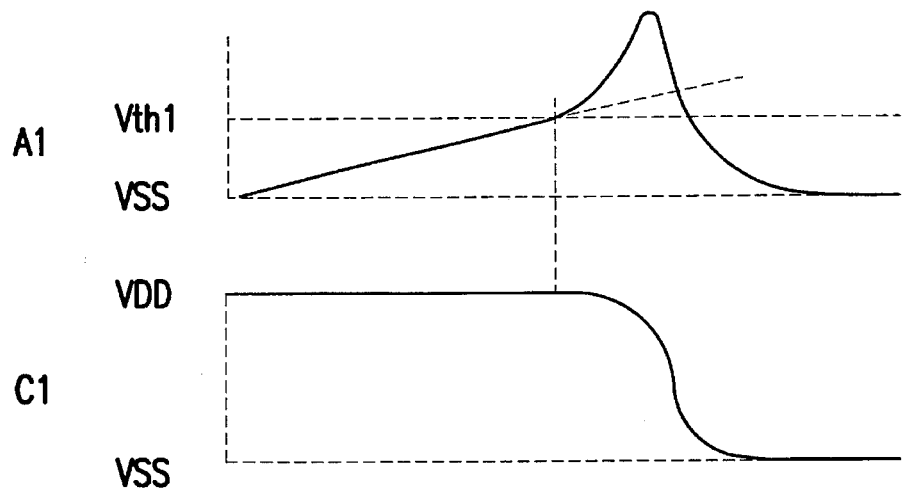
Figure 21:
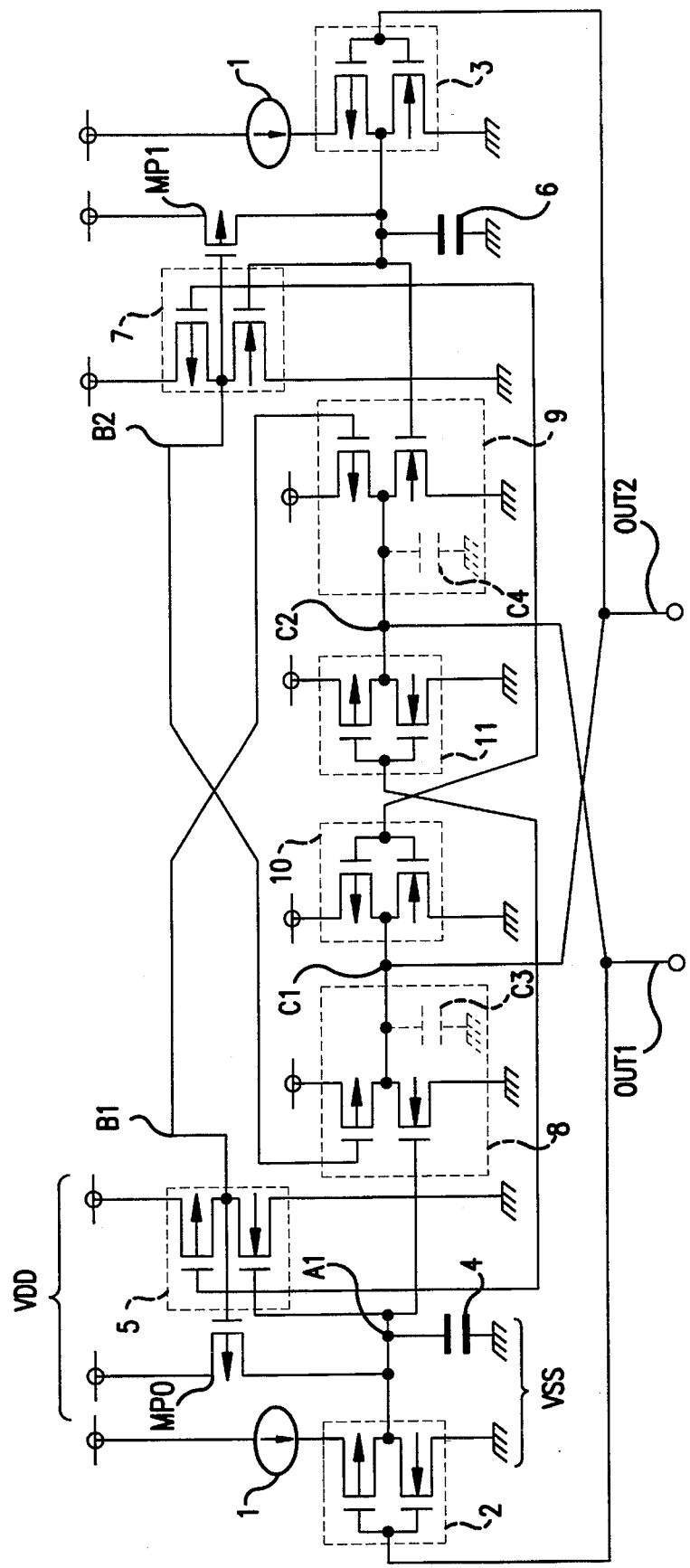
FIG. 21 is a circuit diagram of a further modification of the voltage-controlled oscillator circuit shown in FIG. 1.

A modification of the example already described in conjunction with FIG. 1 is next described. Referring to FIG. 21, a P-channel MOS transistor MP0 acting as the first auxiliary charging circuit is connected between the terminal A1 and the power supply terminal VDD. The gate of the P-channel MOS transistor MP0 is connected with the drain of the N-channel MOS transistor of the comparator circuit 5. Similarly, a P-channel MOS transistor MP1 serving as the second auxiliary charging circuit is connected to the right of the circuit. When the potential at the terminal A1 is detected exceeding the threshold value Vth1, the voltage at the terminal A1 is increased at a higher rate. That is, as shown in FIG. 20(c), if the potential at the terminal A1 exceeds the threshold value Th1, the N-channel MOS transistor of the first comparator circuit 5 turns on, thus driving the P-channel MOS transistor MP0 into conduction. The potential at the terminal A1 is increased at a higher rate. Variation of the state of the terminal C1 is also accelerated.

The operation of the circuit modified in this way is described by referring to FIG. 21. We assume that the P-channel MOS transistor of the first CMOS inverter 2 is turned on and that the first capacitive element 4 is started to be charged by the action of the voltage-controlled current source 1. It is further assumed that the voltages at the terminals B1, C1, and B2 are all in state H. The voltage at the terminal C2 is assumed to be in state L. Under this condition, if the voltage at the terminal A1 is increased beyond the threshold value Vth1 by the charging, then the N-channel MOS transistors of the first comparator circuit 5 and of the first dynamic latch circuit 8 turn on. These conducting N-channel MOS transistors begin to supply electric currents corresponding to the difference with the threshold value Vth1. In this way, the terminals B1 and C1 are discharged. The voltages at the terminals vary from level H toward level L. If the voltage at the terminal B1 as viewed from the power supply terminal VDD becomes lower than the threshold value Vth4 of the P-channel MOS transistor MP0, then this transistor MP0 turns on, thus accelerating the charging of the terminal A1. As a result, the difference between the voltage at the terminal A1 and the threshold value Vth1 increases rapidly. This increases the current values of the N-channel MOS transistors of the first comparator circuit 5 and of the first dynamic latch circuit 8. Consequently, the P-channel MOS transistor is caused to conduct heavily, which in turn accelerates the charging of the terminal A1 further. This feedback operation provided by the P-channel MOS transistor MP0 accelerates the rise of the potential at the terminal A1 after the potential at the terminal A1 has passed across the threshold value Vth1.

In step with this operation, the potential at the terminal C2 rises. If the voltage at the terminal C2 exceeds the threshold value Vth3 of the first CMOS inverter 2, the N-channel MOS transistor of the first CMOS inverter 2 conducts heavily. The first capacitive element 4 is changed from a charged state to a discharged state. Simultaneously with the discharging, the voltage at the terminal C1 drops. If this voltage as viewed from the power supply terminal VDD becomes lower than the threshold value Vth2 of the P-channel MOS transistor of the first comparator circuit 5, then this P-channel MOS transistor turns on. As a result, the voltage at the terminal B1 begins to rise. This weakens the effect of the feedback operation provided by the P-channel MOS transistor MP0. Finally, the transistor MP0 is turned off. Hence, discharging of the first capacitive element 4 is not hindered by the P-channel MOS transistor MP0.

Figure 22A:
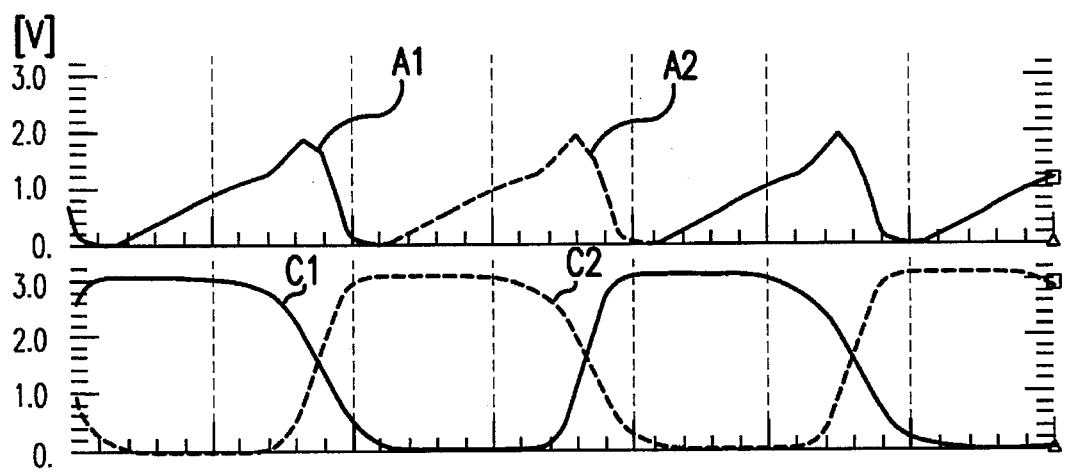
FIGS. 22(a) and 22(b) are waveform diagrams illustrating the operation of the circuit shown in FIG. 21.
Figure 22B:
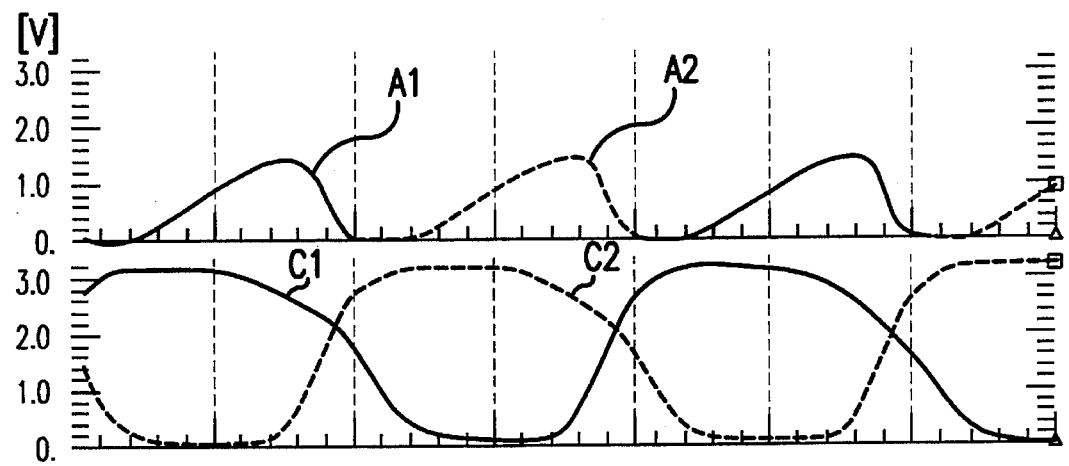

The operation described thus far is also performed for the P-channel MOS transistor MP1. Simulation waveforms at the terminals A1, A2, C1, and C2 where the P-channel MOS transistors MP0 and MP1 are provided are shown in FIG. 22(a). Simulation waveforms at the terminal A1, A2, C1, and C2 where none of the P-channel MOS transistors MP0 and MP1 are provided are shown in FIG. 22(b).

Because of the operations described thus far, if the charging time required until the potential at the terminal A1 or A2 reaches the threshold value Vth1 is prolonged to lower the oscillation frequency, then the potential is rapidly increased after the threshold value Vth1 is exceeded. The potential at the terminal A1 or A2 can rapidly pass across values close to the threshold value Vth1 at which the circuit is more affected by noises. Hence, the stability of the operation can be enhanced. Furthermore, the voltage at the terminal C1 drops at a higher rate. In addition, the duty cycle can be controlled better.

Preferably, the threshold value Vth4 of the P-channel MOS transistors MP0 and MP1 and the threshold value Vth2 of all the other P-channel MOS transistors have satisfy the relation given by $$|Vth4|<|Vth2|$$

in order to make the feedback operation effective before the output from the first comparator circuit 5, i.e., the voltage at the terminal B1, begins to rise. However, when the P-channel MOS transistor of the first comparator circuit 5 begins to conduct, the N-channel MOS transistor is still conducting. Therefore, the voltage at the terminal B1 does not immediately start to rise. Consequently, the relationship given by Vth4=Vth2 is permitted.

The use of these P-channel MOS transistors MP0 and MP1 is not limited to the example described in connection with FIG. 1. Rather, these P-channel MOS transistors MP0 and MP1 can be similarly added with similar utility to the above examples other than the example shown in FIG. 1. Furthermore, the conductivity type is not restricted to the P-channel. The conductivity type may also be appropriately modified according to the situations. For example, if these P-channel MOS transistors are added to the circuit shown in FIG. 16, the conductivity type may be changed from the P-channel to the N-channel. At this time, the source electrode is connected with the power supply terminal VSS.

According to the present invention, higher-speed operation can be accomplished than the prior art double-capacitor type voltage-controlled oscillator circuit by the use of first and second dynamic latch circuits. Also, the oscillation frequency can be improved. In addition, more stable and higher-speed oscillation can be established by connecting two CMOS inverters in series in two opposite senses between the outputs of the first and second dynamic latch circuits.

In the above-described operation for inverting the output, the P-channel and N-channel MOS transistors of the first and second dynamic latch circuits simultaneously conduct or only one conducts; any other state is not assumed. Consequently, the currents passing through them can be suppressed.

Furthermore, similarly to the prior art double-capacitor type voltage-controlled oscillator circuit, the period for which the output is at level H and the period for which the output is at level L are determined by only one type of MOS transistors, i.e., either the P-channel MOS transistors or the N-channel MOS transistors. Therefore, the duty cycle can be controlled well.

In a flip-flop, a plurality of transistors are inserted between the power supply and the output terminal. The novel circuit does not have such a configuration. As a consequence, the circuit is operated at low power voltages.

As described thus far, the invention can provide a voltage-controlled oscillator circuit which is capable of operating at low power voltages, consumes only a small amount of electric power, permits the duty cycle to be controlled well, and is able to operate at high speeds.

Where a capacitive element is connected between the outputs of the first and second CMOS inverters, the symmetry of the circuit can be improved.

In the techniques set forth in claims 13 and 14, after the threshold values at which the first and second dynamic latch circuits and the comparator circuits are switched to their respective other states are reached, the first and second capacitive elements accelerate rises of the charging voltages. This stabilizes the switching operation of the first and second dynamic latch circuits and of the comparator circuits. Consequently, stable operation can be assured. As a whole, the times in which the first and second capacitive elements are charged can be prolonged. Hence, the oscillation frequency can be lowered.

What is claimed is:

1. A voltage-controlled oscillator circuit comprising:

a current source for producing an electric current which is controlled by an input voltage;

a first and a second CMOS inverters connected with said current source;

a first capacitive element connected with an output of said first CMOS inverter and electrically charged by the electric current from said current source via said first CMOS inverter, said first capacitive element being discharged via said first CMOS inverter;

a first comparator circuit for producing an output assuming a different state, depending on whether a charging voltage for said first capacitive element has exceeded a reference voltage or not;

a second capacitive element connected with an output of said second CMOS inverter and electrically charged by the electric current from said current source via said second CMOS inverter, said second capacitive element being discharged via said second CMOS inverter;

a second comparator circuit for producing an output assuming a different state, depending on whether a charging voltage for said second capacitive element has exceeded a reference voltage or not;

a first dynamic latch circuit consisting of a series combination of an N-channel MOS transistor and a P-channel MOS transistor together with an output terminal connected to a junction of said N-channel and P-channel MOS transistors, one of said MOS transistors having a gate receiving the charging voltage for said first capacitive element, the other of said MOS transistors having a gate receiving the output from said second comparator circuit;

a second dynamic latch circuit consisting of a series combination of an N-channel MOS transistor and a P-channel MOS transistor together with an output terminal connected to a junction of said N-channel and P-channel MOS transistors, one of said MOS transistors having a gate receiving the charging voltage for said second capacitive element, the other of said MOS transistors having a gate receiving the output from said first comparator circuit;

wherein an input of said first CMOS inverter is connected with one of an inverted output of said first dynamic latch circuit or an output of said second comparator circuit, an input of said second CMOS inverter is connected with one of an inverted output of said second dynamic latch circuit or an output of said first comparator circuit.

2. The voltage-controlled oscillator circuit of claim 1, wherein said first and second dynamic latch circuits have parasitic capacitances at said junction.

3. The voltage-controlled oscillator circuit of claim 1, wherein two CMOS inverters are connected in parallel in two opposite senses between outputs of said first and second dynamic latch circuits.

4. A voltage-controlled oscillator circuit comprising:
a current source for producing an electric current which is controlled by an input, voltage;
a first and a second CMOS inverters connected with said current source;
a first capacitive element connected with an output of said first CMOS inverter and electrically charged by the electric current from said current source via said first CMOS inverter, said first capacitive element being discharged via said first CMOS inverter;
a first comparator circuit for producing an output assuming a different state, depending on whether a charging voltage for said first capacitive element has exceeded a reference voltage or not;
a third CMOS inverter connected to an output of said first comparator circuit;
a second capacitive element connected with an output of said second CMOS inverter and electrically charged by the electric current from said current source via said second CMOS inverter, said second capacitive element being discharged via said second CMOS inverter;
a second comparator circuit for producing an output assuming a different state, depending on whether a charging voltage for said second capacitive element has exceeded a reference voltage or not;
a fourth CMOS inverter connected to an output of said second comparator circuit;
a first dynamic latch circuit consisting of a series combination of an N-channel MOS transistor and a P-channel MOS transistor together with an output terminal connected to a junction of said N-channel and P-channel MOS transistors, one of said MOS transistors having a gate receiving the output from said first comparator circuit, the other of said MOS transistors having a gate receiving an output from said fourth CMOS inverter;
a second dynamic latch circuit consisting of a series combination of an N-channel MOS transistor and a P-channel MOS transistor together with an output terminal connected to a junction of said N-channel and P-channel MOS transistors, one of said MOS transistors having a gate receiving the output from said second comparator circuit, the other of said MOS transistors having a gate receiving an output from said third CMOS inverter;
wherein an input of said first CMOS inverter is connected with an output of said first dynamic latch circuit or an inverted output of said second comparator circuit, an input of said second CMOS inverter is connected with an output of said second dynamic latch circuit or an inverted output of said first comparator circuit.

5. The voltage-controlled oscillator circuit of claim 4, wherein said first and second dynamic latch circuits have parasitic capacitances at said junction.

6. The voltage-controlled oscillator circuit of claim 4, wherein two CMOS inverters are connected in parallel in two opposite senses between outputs of said first and second dynamic latch circuits.

7. A voltage-controlled oscillator circuit comprising:
a current source for producing an electric current which is controlled by an input voltage;
a first and a second CMOS inverters connected with said current source;
a first and a second capacitive elements connected between an output of said first CMOS inverter and an output of said second CMOS inverter and alternately electrically charged in two opposite directions by the electric current from said current source via said first CMOS inverter and said second CMOS inverter, respectively;
a first comparator circuit for producing an output assuming a different state, depending on whether a charging voltage for said first capacitive element has exceeded a reference voltage or not when said first capacitive element is being charged via said first CMOS inverter;
a second comparator circuit for producing an output assuming a different state, depending on whether a charging voltage for said second capacitive element has exceeded a reference voltage or not when said second capacitive element is being charged via said second CMOS inverter;
a first dynamic latch circuit consisting of a series combination of an N-channel MOS transistor and a P-channel MOS transistor together with an output terminal connected to a junction of said N-channel and P-channel MOS transistors, one of said MOS transistors having a gate receiving said charging voltage for said first capacitive element when said first capacitive element is being charged via said first CMOS inverter, the other of said MOS transistors having a gate receiving an output from said second comparator circuit;
a second dynamic latch circuit consisting of a series combination of an N-channel MOS transistor and a P-channel MOS transistor together with an output terminal connected to a junction of said N-channel and P-channel MOS transistors, one of said MOS transistors having a gate receiving said charging voltage for said second capacitive element when said second capacitive element being charged via said second CMOS inverter, the other of said MOS transistors having a gate receiving an output from said first comparator circuit;
wherein an input of said first CMOS inverter is connected with one of an inverted output of said first dynamic latch circuit or an output of said second comparator circuit, an input of said second CMOS inverter is connected with one of an inverted output of said second dynamic latch circuit or an output of said first comparator circuit.

8. The voltage-controlled oscillator circuit of claim 7, wherein said first and second dynamic latch circuits have parasitic capacitances at said junction.

9. The voltage-controlled oscillator circuit of claim 7, wherein two CMOS inverters are connected in parallel in two opposite senses between outputs of said first and second dynamic latch circuits.

10. A voltage-controlled oscillator circuit comprising:
a current source for producing an electric current which is controlled by an input voltage;
a first and a second CMOS inverters connected with said current source;
a first and a second capacitive elements connected between an output of said first CMOS inverter and an output of said second CMOS inverter and alternately electrically charged in two opposite directions by the electric current from said current source via said first CMOS inverter and said second CMOS inverter, respectively;

a first comparator circuit for producing an output assuming a different state, depending on whether a charging voltage for said first capacitive element has exceeded a reference voltage or not when said first capacitive element is being charged via said first CMOS inverter;

a third CMOS inverter connected to an output of said first comparator circuit;

a second comparator circuit for producing an output assuming a different state, depending on whether a charging voltage for said second capacitive element has exceeded a reference voltage or not when said second capacitive element is being charged via said second CMOS inverter;

a fourth CMOS inverter connected to an output of said second comparator circuit;

a first dynamic latch circuit consisting of a series combination of an N-channel MOS transistor and a P-channel MOS transistor together with an output terminal connected to a junction of said N-channel and P-channel MOS transistors, one of said MOS transistors having a gate receiving an output from said first comparator circuit, the other of said MOS transistors having a gate receiving an output from said fourth CMOS inverter;

a second dynamic latch circuit consisting of a series combination of an N-channel MOS transistor and a P-channel MOS transistor together with an output terminal connected to a junction of said N-channel and P-channel MOS transistors, one of said MOS transistors having a gate receiving an output from said second comparator circuit, the other of said MOS transistors having an output from said third CMOS inverter;

wherein an input of said first CMOS inverter is connected an output of said first dynamic latch circuit or an inverted output of said second comparator circuit, an input of said second CMOS inverter is connected with an output of said second dynamic latch circuit or an inverted output of said first comparator circuit.

11. The voltage-controlled oscillator circuit of claim 10, wherein said first and second dynamic latch circuits have parasitic capacitances at said junction.

12. The voltage-controlled oscillator circuit of claim 10, wherein two CMOS inverters are connected in parallel in two opposite senses between outputs of said first and second dynamic latch circuits.

13. The voltage-controlled oscillator circuit of any one of claims 1–12, further comprising a first and a second auxiliary charging circuits for increasing rates at which said charging voltages for said first and second capacitive elements are increased after said charging voltages have exceeded their reference voltages.

14. The voltage-controlled oscillator circuit of any one of claims 1–12, wherein each of said first and second comparator circuits comprises a series combination of MOS transistors having different conductivity types from each other, which are connected with their drains between power supply terminals of different potential from each other, an output terminal consists a conjunction of said MOS transistors of said series, an input terminal consists a gate of one of said MOS transistors of said series, additionally, said first and second comparator circuits are connected to a first and second auxiliary charging circuits, respectively, wherein each of said first and second auxiliary charging circuits consists an MOS transistor having the same conductivity type as the other MOS transistor of said MOS transistors of said series, wherein a source of each said MOS transistors of said first and second auxiliary charging circuits is connected to said power supply terminal on the side of the other MOS transistor of said MOS transistors of said series, drains of said MOS transistors of said first and second auxiliary charging circuits are connected to said first and second capacitive elements, respectively, gates of said MOS transistors of said first and second auxiliary charging circuits are connected to said output terminals (said conjunctions) of first and second comparator circuits, respectively.

* * * * *